United States Patent
Zhang et al.

(10) Patent No.: US 12,248,247 B2
(45) Date of Patent: Mar. 11, 2025

(54) WIRE GRID POLARIZER AND FABRICATION METHOD THEREFOR

(71) Applicant: BOE Technology Group Co., Ltd., Beijing (CN)

(72) Inventors: Xiao Zhang, Beijing (CN); Yongxing Liu, Beijing (CN); Jiahui Han, Beijing (CN); Hua Huang, Beijing (CN); Kang Guo, Beijing (CN); Xin Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 487 days.

(21) Appl. No.: 17/764,418

(22) PCT Filed: May 19, 2021

(86) PCT No.: PCT/CN2021/094526
§ 371 (c)(1),
(2) Date: Mar. 28, 2022

(87) PCT Pub. No.: WO2022/001447
PCT Pub. Date: Jan. 6, 2022

(65) Prior Publication Data
US 2022/0373884 A1    Nov. 24, 2022

(30) Foreign Application Priority Data

Jun. 30, 2020   (CN) .......................... 202010620071.7

(51) Int. Cl.
*G02B 5/30*     (2006.01)
*G03F 7/00*     (2006.01)
(52) U.S. Cl.
CPC ......... *G03F 7/0007* (2013.01); *G02B 5/3058* (2013.01)

(58) Field of Classification Search
CPC .......................... G03F 7/0007; G02B 5/3058
(Continued)

(56) References Cited

U.S. PATENT DOCUMENTS 7,961,393 B2 * 6/2011 Perkins ................ G02B 5/3058
                                                      359/485.05
8,420,499 B2 * 4/2013 Ariga ..................... G11B 5/855
                                                      257/E21.038
(Continued)

FOREIGN PATENT DOCUMENTS

CN          102084275 A      6/2011
CN          102549482 A      7/2012
(Continued)

OTHER PUBLICATIONS

CN 202010620071.7 first office action.
PCT/CN2021/094526 international search report and written opinion.

*Primary Examiner* — Ricky D Shafer
(74) *Attorney, Agent, or Firm* — IPro, PLLC

(57) ABSTRACT

Wire grid polarizer and manufacturing method thereof are provided, the wire grid polarizer includes: substrate; first wire grid formed on substrate, including first wire grid reflection strips arranged parallel to each other and at equal intervals; second wire grid formed at a side of first wire grid away from substrate, including second wire grid reflection strips arranged in parallel to each other and at equal intervals; second wire grid reflection strips are in one-to-one correspondence with first wire grid reflection strips; orthographic projections of second wire grid reflection strip onto substrate falls within orthographic projections of corresponding first wire grid reflection strip onto substrate; wire width of second wire grid reflection strip is less than that of (Continued)

US 12,248,247 B2

Page 2 first wire grid reflection strip; and wire spacing of second wire grid reflection strip is greater than that of the first wire grid reflection strip.

16 Claims, 6 Drawing Sheets

(58) Field of Classification Search
USPC .................................... 359/485.05, 487.03
See application file for complete search history.

(56) References Cited

U.S. PATENT DOCUMENTS

| | | | |
|---|---|---|---|
| 9,158,052 B2* | 10/2015 | Kim | G02B 5/3058 |
| 10,310,155 B2* | 6/2019 | Nielson | G02B 5/045 |
| 2006/0119937 A1* | 6/2006 | Perkins | G02B 5/3058 |
| | | | 359/485.05 |
| 2007/0165307 A1* | 7/2007 | Perkins | G02B 5/3058 |
| | | | 359/485.05 |
| 2011/0096396 A1 | 4/2011 | Kaida et al. | |
| 2012/0086887 A1 | 4/2012 | Lee et al. | |
| 2013/0215506 A1 | 8/2013 | Yao et al. | |
| 2013/0271834 A1 | 10/2013 | Kim et al. | |
| 2015/0116824 A1* | 4/2015 | Wang | G02B 1/08 |
| | | | 359/485.05 |
| 2015/0116825 A1* | 4/2015 | Wang | G02B 5/3058 |
| | | | 359/485.05 |
| 2015/0241613 A1 | 8/2015 | Chan et al. | |
| 2016/0033701 A1 | 2/2016 | Yang et al. | |
| 2016/0274285 A1 | 9/2016 | Kang et al. | |
| 2017/0059758 A1* | 3/2017 | Wang | G02B 5/3058 |
| 2017/0184768 A1* | 6/2017 | Probst | G02B 1/12 |
| 2018/0052270 A1* | 2/2018 | Nielson | G02B 5/3058 |
| 2018/0081103 A1 | 3/2018 | Takeda | |
| 2018/0143365 A1* | 5/2018 | Nielson | G02B 5/045 |
| 2019/0137676 A1 | 5/2019 | Nam et al. | |
| 2019/0331840 A1 | 10/2019 | Takada | |
| 2021/0208323 A1 | 7/2021 | Shibuya et al. | |
| 2022/0308275 A1* | 9/2022 | Gu | G02F 1/133548 |

FOREIGN PATENT DOCUMENTS

| | | |
|---|---|---|
| CN | 103197368 A | 7/2013 |
| CN | 104854487 A | 8/2015 |
| CN | 105683816 A | 6/2016 |
| CN | 106711088 A | 5/2017 |
| CN | 107121719 A | 9/2017 |
| CN | 107167863 A | 9/2017 |
| CN | 107407770 A | 11/2017 |
| CN | 108474894 A | 8/2018 |
| CN | 110398799 A | 11/2019 |
| CN | 110998383 A | 4/2020 |
| JP | 2007052084 A | 3/2007 |
| JP | 2010117646 A | 5/2010 |
| KR | 20090025797 A | 3/2009 |
| KR | 20090064109 A | 6/2009 |
| KR | 20110113968 A | 10/2011 |
| KR | 20120040871 A | 4/2012 |
| KR | 20120073802 A | 7/2012 |
| KR | 20130000756 A | 1/2013 |
| KR | 20130003197 A | 1/2013 |
| KR | 20180075968 A | 7/2018 |
| TW | 201135287 A | 10/2011 |

* cited by examiner

WIRE GRID POLARIZER AND FABRICATION METHOD THEREFOR

CROSS REFERENCE TO RELATED APPLICATIONS

This application is the U.S. national phase of PCT Application No. PCT/CN2021/094526 filed on May. 19, 2021, which claims priority to Chinese Patent Application No. 202010620071.7, filed in China on Jun. 30, 2020, the disclosure of which is incorporated herein by reference in its entirety.

TECHNICAL FIELD

The present disclosure relates to the field of displaying technology, and in particular, to a wire grid polarizer and a manufacturing method thereof.

BACKGROUND

LCD (Liquid Crystal Display) generally includes components such as an array substrate, a color film substrate and a backlight source. A surface of the color film substrate opposite to the array substrate is provided with a wire grid polarizer (WGP, Wire Grid Polarizer), and the wire grid polarizer is one type of Polarizer.

Currently, the WGP includes a plurality of reflection wire grid strips such as a metal wire grid strip arranged on a substrate, the reflection wire grid strips are arranged parallel to each other and equally spaced, a period of the WGP is much smaller than a wavelength of an incident light, and the WGP exhibits a good polarization characteristic over a wide range of wavelength, which can achieve both a high transmission for TM polarization (electric vector perpendicular to the wire grid direction) and a high reflection for TE polarization (electric vector parallel to the wire grid direction).

The WGP preparation process is generally accomplished by the photolithographic process or nano-imprinting technology. Large area photolithography is expensive and requires a high uniformity. The nano-imprinting technology has become an important technology for preparing nanostructures due to its lower production cost and a high pattern resolution. In a wire grid polarizer prepared by the nano-imprinting technology, a nano-metal pattern can be integrated on a display substrate, which has advantages such as high integration, high backlight utilization, resistance to high temperature, light and thin. Such a technology has great application prospects in micro-nano devices, integrated optics and products with low power consumption.

Compared with a WGP with a single layer, a WGP with stacked layers has a higher reflection intensity for the TE light, a less influence on a transmission intensity of the TM light, and a higher extinction ratio, so that the polarization effect is greatly improved while ensuring the transmittance of device. The theoretical degree of polarization of the WGP with stacked layers can reach 99.9999 or more, but the WGP with stacked layers also has a disadvantage, namely, a low transmittance, which may affect the use of the WGP with stacked layers.

SUMMARY

According to embodiments of the present disclosure, a wire grid polarizer and a manufacturing method thereof are provided, which can ensure that the wire grid polarizer has both a high degree of polarization and a high transmittance. The process is simplified and an optical performance of a display device is improved.

Technical solutions provided by embodiments of the present disclosure are as follows.

A wire grid polarizer, including:
a substrate;
a first wire grid, formed on the substrate, the first wire grid comprising a plurality of first wire grid reflection strips arranged parallel to each other and at equal intervals; and
a second wire grid, formed at a side of the first wire grid away from the substrate, the second wire grid comprising a plurality of second wire grid reflection strips arranged in parallel to each other and at equal intervals;
wherein the plurality of second wire grid reflection strips is in one-to-one correspondence with the plurality of first wire grid reflection strips, an orthographic projection of one of the plurality of second wire grid reflection strips onto the substrate falls within an orthographic projection of a corresponding one of the plurality of first wire grid reflection strips onto the substrate, and a wire width for the plurality of second wire grid reflection strips is less than a wire width for the plurality of the first wire grid reflection strips, and a wire spacing for the plurality of second wire grid reflection strips is greater than a wire spacing for the plurality of first wire grid reflection strips.

Illustratively, the second wire grid includes:
a plurality of imprinting adhesive grid strips, arranged parallel to each other and at equal intervals, wherein the plurality of imprinting adhesive grid strips is formed by using an imprinting adhesive material, each of the plurality of imprinting adhesive grid strips comprises a top end located at a side away from the substrate, a bottom end located at a side adjacent to the substrate, and a side face located between the top end and the bottom end; and
a plurality of reflection grid strips, arranged in parallel to each other and at equal intervals, wherein the plurality of reflection grid strips is formed by using a wire grid reflection material, the plurality of reflection grid strips is in one-to-one correspondence with the plurality of imprinting adhesive grid strips, and each of the plurality of reflection grid strips covers a top end and a side face of a corresponding one of the plurality of imprinting adhesive grid strips.

Illustratively, a ratio of a wire width for the plurality of imprinting adhesive grid strips to a wire width for the plurality of reflection grid strips ranges from 1:2 to 1:1, and a ratio of a height for the plurality of imprinting adhesive grid strips to a height for the plurality of reflection grid strip ranges from 1:2 to 4:5.

Illustratively, the second wire grid includes:
a plurality of imprinting adhesive grid strips, arranged parallel to each other and at equal intervals, wherein the plurality of imprinting adhesive grid strips is formed by using an imprinting adhesive material, each of the plurality of imprinting adhesive grid strips comprises a top end located at a side away from the substrate, a bottom end located at a side adjacent to the substrate, and a side face located between the top end and the bottom end; and
a plurality of reflection grid strips, arranged in parallel to each other and at equal intervals, wherein the plurality of reflection grid strips is formed by using a wire grid reflection material, the plurality of reflection grid strips is in one-to-one correspondence with the plurality of imprinting adhesive grid strips, and each of the plurality of reflection grid strips is only located on a top end of a corresponding one of the plurality of imprinting adhesive grid strips.

Illustratively, a wire width for the plurality of imprinting adhesive grid strips is the same or substantially the same as a wire width for the plurality of reflection grid strip, and a ratio of a height for the plurality of imprinting adhesive grid strips to a height for the plurality of reflection grid strips ranges from 3:1 to 5:1.

Illustratively, the wire grid reflection material of the first wire grid reflection strip is selected as a metal material.

In the plurality of second wire grid reflection strips, the imprinting adhesive material for the plurality of imprinting adhesive grid strips is selected as a resin material, and the wire grid reflection material for the plurality of reflection grid strips is selected as a metal material.

Illustratively, the wire grid polarizer further includes at least one intermediate buffer layer located between the first wire grid and the second wire grid.

Illustratively, the layer number of the at least one intermediate buffer layer is less than or equal to 3.

Illustratively, the layer number of the at least one intermediate buffer layer is only one, and the at least one intermediate buffer layer is formed by using at least one material selected from silicon nitride and silicon oxide.

Illustratively, a film layer thickness for the at least one intermediate buffer layer ranges from 0.8 microns to 1.0 microns.

Illustratively, the plurality of first wire grid reflection strips is formed only by a first wire grid reflection material, and the plurality of reflection grid strips in the plurality of second wire grid reflection strips is formed only by a second wire grid reflection material; or
the plurality of first wire grid reflection strip each comprises a first wire grid reflection material strip and a first mask photoresist strip overlaid on a side of the first wire grid reflection material strip away from the substrate, and the plurality of reflection grid strips in the plurality of second wire grid reflection strips each comprises a second wire grid reflection material strip and a second mask photoresist strip overlaid on a side of the second wire grid reflection material strip away from the substrate.

A wire grid polarizer, including:
a substrate;
a first wire grid, formed on the substrate, the first wire grid comprises a plurality of first wire grid reflection strips arranged parallel to each other and at equal intervals; and
a second wire grid, formed at a side of the first wire grid away from the substrate, the second wire grid comprises a plurality of second wire grid reflection strips arranged in parallel to each other and at equal intervals;
wherein the plurality of second wire grid reflection strips is in one-to-one correspondence with the plurality of first wire grid reflection strips, an orthographic projection of each of the plurality of second wire grid reflection strips onto the substrate falls within an orthographic projection of a corresponding one of the plurality of first wire grid reflection strips onto the substrate, and the second wire grid is in direct contact with the first wire grid.

Illustratively, each of the plurality of first wire grid reflection strips comprises a first wire grid reflection material strip and a first mask photoresist strip overlaid on a side of the first wire grid reflection material strip away from the substrate; the plurality of second wire grid reflection strips each comprises a second wire grid reflection material strip and a second mask photoresist strip overlaid on a side of the second wire grid reflection material strip away from the substrate.

Illustratively, a wire width for the plurality of second wire grid reflection strips is equal to a wire width for the plurality of first wire grid reflection strips, and a wire spacing for the plurality of second wire grid reflection strips is equal to a wire spacing for the plurality of first wire grid reflection strips.

A method of manufacturing a wire grid polarizer, wherein the method is for manufacturing the wire grid polarizer as described above, the method includes:
providing a substrate;
forming a first wire grid on the substrate, wherein the first wire grid comprises a plurality of first wire grid reflection strips arranged parallel to each other and at equal intervals;
forming a second wire grid on a side of the first wire grid away from the substrate, wherein the second wire grid comprises a plurality of second wire grid reflection strips arranged in parallel to each other and at equal intervals;
wherein the plurality of second wire grid reflection strips is in one-to-one correspondence with the plurality of first wire grid reflection strips, an orthographic projection of one of the plurality of second wire grid reflection strips onto the substrate falls within an orthographic projection of a corresponding one of the plurality of first wire grid reflection strips onto the substrate, and a wire width for the plurality of second wire grid reflection strips is less than a wire width for the plurality of first wire grid reflection strips, and a wire spacing for the plurality of second wire grid reflection strips is greater than a wire spacing for the plurality of first wire grid reflection strips.

Illustratively, the step of forming a first wire grid on the substrate, the first wire grid comprising a plurality of first wire grid reflection strips arranged parallel to each other and at equal intervals specifically including:
forming a first reflection material layer on the substrate;
forming, by a nano-imprinting, a plurality of first imprinting adhesive nano-photoresist strips arranged parallel to each other and at equal intervals on the first reflection material layer;
etching, with the plurality of the first imprinting adhesive nano-photoresist strips as a mask, the first reflection material layer to form a plurality of first wire grid reflection strips arranged parallel to each other and at equal intervals, and removing the plurality of first imprinting adhesive nano-photoresist strips to form the first wire grid.

Illustratively, the step of forming a second wire grid on a side of the first wire grid away from the substrate, the second wire grid comprising a plurality of second wire grid reflection strips arranged in parallel to each other and at equal intervals specifically including:
forming an intermediate buffer layer on a side of the first wire grid away from the substrate;
forming, by a nano-imprinting, a plurality of second imprinting adhesive nano-photoresist strips arranged parallel to each other and at equal intervals on the intermediate buffer layer;
performing an ashing treatment on the plurality of second imprinting adhesive nano-photoresist strips to form imprinting adhesive grid strips;

depositing a second reflection material layer on the imprinting adhesive grid strips; and performing a dry etching on the second reflection material layer to form reflection grid strips, wherein each of the reflection grid strips only covers a top end of a corresponding one of the imprinting reflection grid strips, or each of the reflection grid strips covers a top end and a side face of a corresponding one of the imprinting reflection grid strips, and the imprinting adhesive grid strips and the reflection grid strips form the plurality of second reflection grid strip.

Illustratively, in the method, a nano-imprinting template used in forming the plurality of first imprinting adhesive nano-photoresist strips and a nano-imprinting template used in forming the plurality of second imprinting adhesive nano-photoresist strips are the same template.

A method of manufacturing a wire grid polarizer, wherein the method is for manufacturing the wire grid polarizer as described above, the method includes:

providing a substrate;

forming a first reflection material layer, a first photoresist material layer, a second reflection material layer and a second photoresist material layer in the sequence listed on the substrate;

forming, by a nano-imprinting, a plurality of imprinting adhesive nano-photoresist strips arranged parallel to each other and at equal intervals on the second photoresist material layer;

etching, with the plurality of imprinting adhesive nano-photoresist strips as a mask, the second photoresist material layer to pattern and form a plurality of second mask photoresist strips arranged parallel to each other and at equal intervals;

removing the plurality of imprinting adhesive nano-photoresist strip, and performing a dry etching, with the plurality of second mask photoresist strips as a mask, on the second reflection material layer to pattern and form a plurality of second wire grid reflection material strips arranged parallel to each other and at equal intervals, wherein the plurality of second mask photoresist strips and the plurality of second wire grid reflection material strips are stacked to form the plurality of second wire grid reflection material strips;

etching, with the plurality of second mask photoresist strips as a mask, the first photoresist material layer to pattern and form a plurality of first mask photoresist strips arranged parallel to each other and at equal intervals; and performing a dry etching on the first reflection material layer to pattern and form a plurality of first wire grid reflection material strips arranged parallel to each other and at equal intervals, wherein the plurality of first mask photoresist strips and the plurality of first wire grid reflection material strips are stacked to form the plurality of second wire grid reflection strip.

Illustratively, a thickness of the second photoresist material layer satisfies a predetermined value so that the second photoresist material layer is not completely etched when performing the dry etching on the second reflection material layer, the first photoresist material layer and the first reflection material layer.

The advantages provided by embodiments of the present disclosure are as follows:

In the wire grid polarizer and the manufacturing method thereof provided by embodiments of the present disclosure, according to an exemplary embodiment, the wire grid polarizer is a WGP with stacked layers. By changing a structure parameter of a second wire grid (namely, an upper layer WGP) located at a side away from a substrate, a wire spacing for the second wire grid is greater than a wire spacing for a first wire grid (namely, a lower layer wire grid), and a wire width of the second wire grid is less than a wire width of the first wire grid. In this way, the WGP with stacked layers can have both a high degree of polarization and a high transmittance, so as to address a poor optical performance of the WGP with stacked layers when used in display products.

In addition, in an exemplary embodiment of the present disclosure, only up to three intermediate buffer layers or no intermediate buffer layers may be provided between two adjacent WGPs, which can save process time. The TR (transmittance) may not vary greatly while a high PE (degree of polarization) of the device can be ensured.

Further, in the method of manufacturing a wire grid polarizer according to an exemplary embodiment of the present disclosure, the process steps can be simplified, the manufacturing cost of an imprinting template can be saved, and the optical characteristics of the device can be improved while ensuring the wire grid polarizer has the characteristics of a high transmittance and a high degree of polarization, so as to address a complex manufacturing process of a WGP with stacked layers and a high manufacturing cost in the related art.

DETAILED DESCRIPTION

Figure 1:
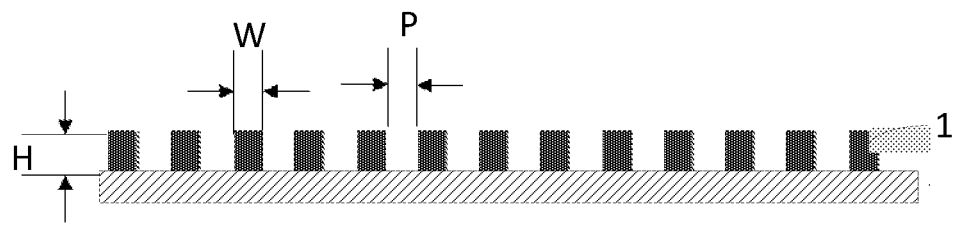
FIG. 1 shows a schematic structural diagram of a monolayer wire grid polarizer in related art.

For the purpose of clarifying the objects, technical solution and advantages of embodiments of the present disclosure, a clear and complete description of the technical solution of embodiments of the present disclosure will be set forth in conjunction with the accompanying drawings of embodiments of the present disclosure. It is evident that the described embodiments are part of embodiments of the present disclosure, rather than all embodiments of the disclosure. Based on the described embodiments of the present disclosure, all other embodiments obtained by a person of ordinary skills in the art without creative effort are included in the protection scope of the present disclosure.

Unless defined otherwise, technical or scientific terms used in this disclosure shall have the ordinary meaning as understood by one of ordinary skills in the art to which this disclosure belongs. The use of "first", "second", and the like in this disclosure does not denote any order, quantity, or importance, but rather is used to distinguish one element from another. Likewise, terms such as "a", "an", or "the" do not denote a limitation of quantity, but rather denote the presence of at least one referenced item. The word "include" or "comprise", and the like mean that the presence of an element or item preceding the word encompasses the presence of the element or item listed after the word and equivalents thereof, but does not exclude other elements or items. The word "connecting" or "connected" and the like are not limited to physical or mechanical connections, but may include electrical connections, whether direct or indirect. The terms "upper", "lower", "left", "right", etc. are used only to indicate a relative position relationship, which may change accordingly when the absolute position of the described object changes.

Before giving a detailed description of the wire grid polarizer and manufacturing method thereof and the display device provided by embodiments of the present disclosure, the following description of the related art is given first.

In the related art, the wire grid polarizer (WGP) is a new polarizer for Liquid Crystal Display, which, when compared with than the existing iodine-based polarizer, has a better high temperature resistance, and can avoid the paste polarizer (pol) process since the WGP can be integrated on the liquid crystal cell. Furthermore, the WGP is generally only a few hundred nanometers in height, so display devices using WGP is lighter and thinner. Theoretically, the WGP and iodine-based polarizer have similar optical properties. For example, general performance indicators of iodine-based polarizer are transmittance 42.3% and degree of polarization 99.99%. In an example in which the WGP has grating structure parameters of a wire width 60 um, a wire spacing 60 nm and a height 200 nm, the performance indicators (simulation results) are transmittance 39.0% and degree of polarization 99.999%. However, due to the limitation of process capability, the degree of polarization of the WGP is difficult to reach a level of 99.999% and can only reach a level of 99.9% (actually tested) in general. If a polarizer with the degree of polarization of 99.9% is applied in the display product, an issue of low contrast will arise.

Compared with a monolayer WGP, a wire grid polarizer (WGP) with stacked layers has a higher reflection intensity for TE light (whose electric vector is perpendicular to a direction of the wire grid), a lower transmission intensity for TM light (whose electric vector is parallel to the direction of the wire grid), and a higher extinction ratio, so that the polarization effect is greatly improved while ensuring the transmittance of device. Therefore, in the related art, a scheme of the WGP with stacked layers is adopted to improve the degree of polarization of the WGP, namely, a second layer of WGP is fabricated on the basis of a first layer of WGP, and the first layer of WGP needs to be planarized and protected before the second layer of WGP is fabricated, and thus an intermediate buffer layer is usually provided between the first layer of WGP and the second layer of WGP. The theoretical degree of polarization of such a WGP with stacked layers can reach 99.9999 or more, and the degree of polarization of the WGP with stacked layers can also reach 99.99% or more in the actual testing. However, in the related art, the size parameters for the first layer of WGP and the second layer of WGP in the WGP with stacked layers are the same, resulting in the following issues: the transmittance of the WGP with stacked layers is greatly reduced, and the use of WGP with stacked layers is seriously affected by the low transmittance.

To address the above-mentioned technical issue, embodiments of the present disclosure provides a wire grid polarizer and a manufacturing method thereof, which can ensure that the wire grid polarizer has both a high degree of polarization and a high transmittance. The manufacturing process is simplified and the optical performance of the display device is improved.

Figure 7:
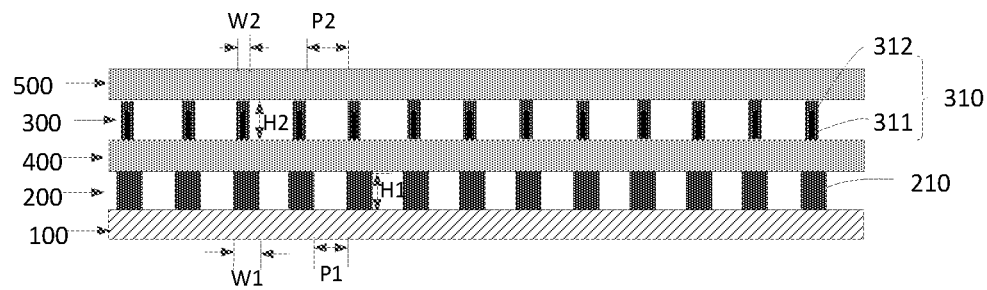
FIG. 7 shows a schematic structural diagram of an exemplary embodiment of a wire grid polarizer provided by the present disclosure.
Figure 9:
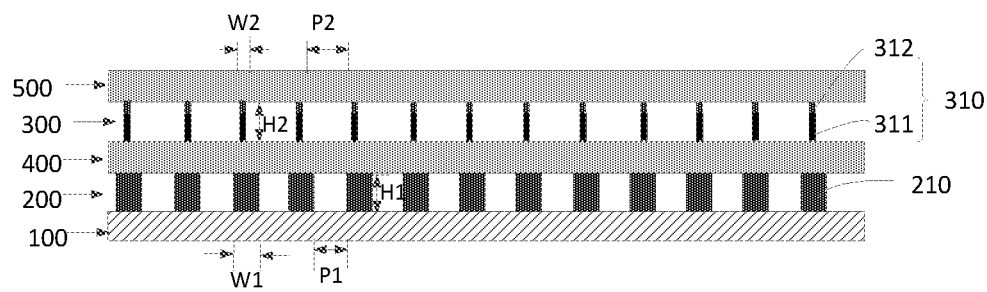
FIG. 9 shows a schematic structural diagram of another exemplary embodiment of a wire grid polarizer provided by the present disclosure.
Figure 11:
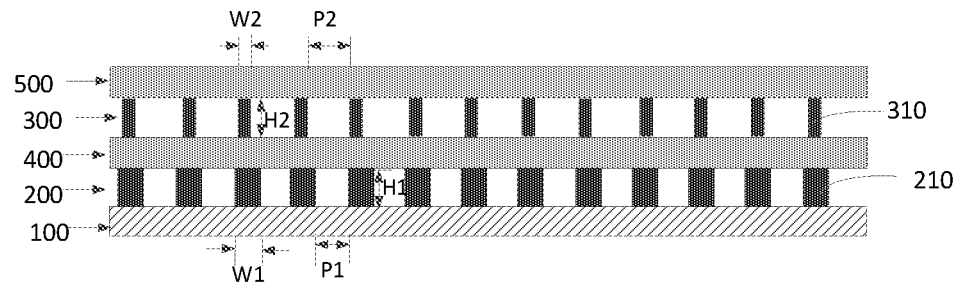
FIG. 11 shows a structural diagram of still another exemplary embodiment of a wire grid polarizer provided by the present disclosure.

As shown in FIGS. 7, 9 and 11, in some embodiments of the present disclosure, the wire grid polarizer includes:

a substrate 100;

a first wire grid 200 formed on the substrate 100, the first wire grid 200 includes a plurality of first wire grid reflection strips 210 arranged in parallel to each other and at equal intervals; and a second wire grid 300 formed at a side of the first wire grid 200 away from the substrate 100, the second wire grid 300 includes a plurality of second wire grid reflection strips 310 arranged in parallel to each other and at equal intervals;

where the second wire grid reflection strips 310 are in one-to-one correspondence with the first wire grid reflection strips 210, an orthographic projection of a second wire grid reflection strip 310 onto the substrate 100 falls within an orthographic projection of a corresponding first wire grid reflection strip 210 onto the substrate 100; and a wire width W2 of the second wire grid reflection strip 310 is less than a wire width W1 of the first wire grid reflection strip 210, a wire spacing P2 for the second wire grid reflection strip 310 is larger than a wire spacing P1 for the first wire grid reflection strip 210.

In embodiments of the present disclosure, the wire grid polarizer is a WGP with stacked layers, namely, the first wire grid 200 and the second wire grid 300 are stacked structures. In the embodiments of the present disclosure, the description is made with an example in which the WGP with stacked layers includes two layers of wire grids. In practical applications, the wire grid polarizer with stacked layers can also have more than two layers of wire grids. all these embodiments should be within the protection range of the present disclosure, as long as the inventive concept is the same as that of the embodiments of the present disclosure, and the description on the WGP with stacked layers which includes more than two layers will omitted herein.

In the wire grid polarizer provided by the embodiments of the present disclosure, the first wire grid 200 includes a plurality of first wire grid reflection strips 210, where the plurality of first wire grid reflection strips 210 is arranged in parallel along the same direction, and any two adjacent first wire grid reflection strips 210 are equally spaced apart, so as to form a "wire grid" structure, which can reflect back a light with a polarization orientation parallel to the first wire grid reflection strips 210, and allow a light with a polarization orientation perpendicular to the first wire grid reflection strips 210 to pass through, namely, such a structure can function as a "polarizer". Similarly, the second wire grid 300 includes a plurality of second wire grid reflection strips 310, where the plurality of second wire grid reflection strips 310 is arranged in parallel in the same direction, and any two adjacent second wire grid reflection strips 310 are equally spaced apart, so as to form a "wire grid" structure, which can reflect back a light with a polarization orientation parallel to the second wire grid reflection strips 310, and allow a light with a polarization orientation perpendicular to the second wire grid reflection strips 310 to pass through, namely, such a structure can function as "polarizer".

The polarized light transmittance of the wire grid polarizer is related to a size parameters of the wire grid reflection strip, where the size parameters includes parameters such as a wire width W, a wire spacing P and a height H of the wire grid reflection strip, and the wire width W of the wire grid reflection strip refers to a width in a direction perpendicular to a strip extending direction of the wire grid reflection strip and parallel to the substrate 100; the wire spacing P for the wire grid reflection strip refers to the size of a gap between two adjacent wire grid reflection strips in the width direction of the wire grid reflection strips; the height H of the wire grid reflection strip refers to a height of the wire grid reflection strip in the direction perpendicular to the substrate 100. By adjusting the size parameters of the wire grid reflection strip, a high polarized light transmittance can be achieved.

In embodiments of the present disclosure, the wire grid polarizer is a WGP with stacked layers, including at least a first wire grid 200 and a second wire grid 300. By changing structure parameters of the second wire grid 300 (namely, an upper layer WGP) located on the side of the first wire grid 200 away from the substrate 100, the wire spacing P2 of the second wire grid 300 may be greater than the wire spacing P1 of the first wire grid 200 (namely, a lower layer wire grid), and the wire width W2 of the second wire grid 300 may be less than the wire width W1 of the first wire grid 200. Compared with the solution in the related art in which the size parameters of the first layer of WGP and the second layer of WGP are the same, the wire spacing for the second wire grid located on an upper layer is increased, so that more light is emitted from gaps between the second wire grid reflection strips 310, and thus the transmittance of the wire grid polarizer can be improved. In this way, the wire grid polarizer provided by embodiments of the present disclosure has both a high degree of polarization and a high transmittance, and thus a poor optical performance of the WGP with stacked layers in display products can be avoided.

In some exemplary embodiments of the present disclosure, for the first wire grid reflection strip 210, the wire width W1 is in a range of 20 nm to 500 nm, the wire spacing P1 is in a range of 20 nm to 500 nm, and the height H1 is in a range of 50 nm to 1000 nm. For the second wire grid reflection strip 310, the wire width W ranges from 20 nm to 500 nm, the wire spacing P ranges from 20 nm to 500 nm, and the height H2 ranges from 50 nm to 1000 nm.

It should be noted that the size parameters of the first wire grid reflection strip 210 and the second wire grid reflection strip 310 are provided by way of example only, and are not limited in practical applications.

Exemplary embodiments for the wire grid polarizer provided by the present disclosure are described hereinafter.

FIG. 7 shows a structural diagram for some exemplary embodiments of the wire grid polarizer provided by the present disclosure. In an exemplary embodiment, as shown in FIG. 7, the second wire grid 300 includes a plurality of imprinting adhesive grid strips 311 and a plurality of reflection grid strips 312. The plurality of imprinting adhesive grid strips 311 is arranged parallel to each other and at equal intervals; and the plurality of reflection grid strips 312 is arranged parallel to each other and at equal intervals. The imprinting adhesive grid strips 311 are formed by an imprinting adhesive material, and each of the imprinting adhesive grid strips 311 includes a top end located at a side away from the substrate 100, a bottom end located adjacent to s side of the substrate 100, and side faces located between the top end and the bottom end, the reflection grid strips 312 are formed by a wire grid reflection material, the reflection grid strips 312 are in one-to-one correspondence with the imprinting adhesive grid strips 311, and each of the reflection grid strips 312 fully covers the top end and the side face(s) of a corresponding one of the imprinting adhesive grid strips 311, so that the imprinting adhesive grid strips 311 and the reflection grid strips 312 form the second wire grid reflection strips 310.

In the above exemplary embodiment, a ratio of the wire width of the imprinting adhesive grid strip to that of the reflection grid strip ranges from 1:2 to 1:1, and a ratio of the height ratio of the imprinting adhesive grid strip to that of the reflection grid strip ranges from 1:2 to 4:5.

It should be noted that the size parameters of the first wire grid reflection strips 210 and the second wire grid reflection strips 310 are provided by way of example only, and are not limited in practical applications.

Further, in the above-described embodiments, the first wire grid 200 may be manufactured by using a process of a nano-imprinting and a dry etching or by a process of a nano-imprinting and an evaporation, etc.

For example, the steps of manufacturing the first wire grid 200 by using a process of a nano-imprinting and a dry etching may be as follows.

First, a substrate 100 is provided.

Then, a first reflection material layer is form on the substrate 100; where the first reflection material layer may be selected as a metal material, such as any one of aluminum, gold, chromium, silver and copper.

A plurality of first imprinting adhesive nano-photoresist strips that is arranged parallel to each other and at equal intervals is then formed on the first reflection material layer by the nano-imprinting.

For example, in some embodiments, the size parameters of the first imprinting adhesive nano-photoresist strips may be as follows. A wire width W1' ranges from 50 nm to 70 nm, a wire spacing P1' ranges from 50 nm to 70 nm, a height H1' ranges from 150 nm to 250 nm. Further, in an example, the wire width W1' is 60 nm, the wire spacing P1' is 60 nm, and the height H1' is 200 nm.

The first reflection material layer is then etched with the plurality of the first imprinting adhesive nano-photoresist strips as a mask, to form a plurality of first wire grid reflection strips 210 arranged parallel to each other and at equal intervals.

For example, in some embodiments, the size parameters of the first wire grid reflection strips 210 of the first wire grid 200 may be as follows. The wire width W1 ranges from 50 nm to 70 nm, the wire spacing P1 ranges from 50 nm to 70 nm, and the height H1 ranges from 150 nm to 250 nm. Further, in an example, the wire width W1 is 60 nm, the wire spacing P1 is 60 nm, and the height H1 is 200 nm.

Figure 14:
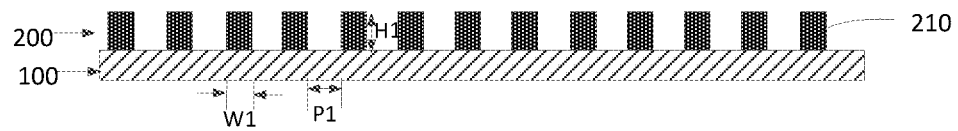
FIG. 14 shows a schematic diagram of step S02 for manufacturing the wire grid polarizer shown in FIG. 7 in a method of manufacturing a wire grid polarizer provided by the present disclosure.

The first imprinting adhesive nano-photoresist strips are then removed to form the first wire grid 200 (as shown in FIG. 14).

After the first wire grid 200 is formed, an intermediate buffer layer 400 may be formed on the first wire grid 200. The intermediate buffer layer 400 can planarize and protect the first wire grid 200, and the intermediate buffer layer 400 may be selected from any one or more of an organic adhesive, silicon oxide or silicon nitride. For example, the intermediate buffer layer 400 is selected as silicon oxide, the thickness is 250 nm, and the refractive index is 1.46.

Size parameters such as the wire width W2 and wire spacing P2 of the second wire grid 300 are different from those of the first wire grid 200. Therefore, if the same process such as the nano-imprinting and dry etching for the first wire grid 200 is still adopted to form the second wire grid 300, another separate imprinting template is needed to be designed for the nano-imprinting process, to form second imprinting adhesive nano-photoresist strips that are different from the first imprinting adhesive nano-photoresist strips in size parameters. Since the imprinting template used by the nano-imprinting is very expensive (usually several hundred thousand China Yuan per template), designing another nano-imprinting template causes an increasing cost.

In order to address the technical issue, in embodiments of the present disclosure, the structure of the second wire grid 300 is also improved, each second wire grid reflection strip 310 can include an imprinting adhesive grid strip 311 and a reflection grid strip 312, and the specific process steps of manufacturing the second wire grid 300 may be as follows.

Figure 16:
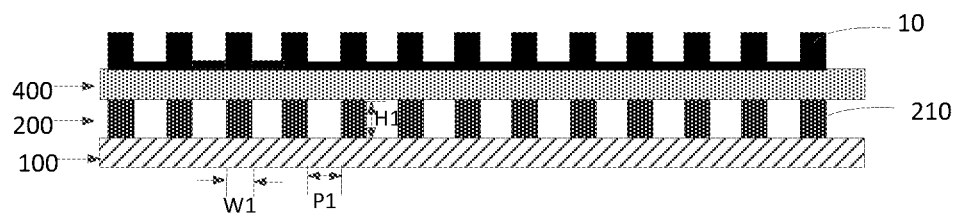
FIG. 16 shows a schematic diagram of step S032 for manufacturing the wire grid polarizer shown in FIG. 7 in the method of manufacturing the wire grid polarizer provided by the present disclosure.

First, a plurality of second imprinting adhesive nano-photoresist strips 10 that is arranged parallel to each other and at equal intervals is formed on the intermediate buffer layer 400 by a nano-imprinting (as shown in FIG. 16).

Where the imprinting template used is the same as the nano-imprinting template used when making the first wire grid 200. For example, in some embodiments, the size parameters of the second imprinting adhesive nano-photoresist strips 10 may be as follows. The wire width W2' ranges from 50 nm to 70 nm, the wire spacing P2' ranges from 50 nm to 70 nm, the height H2' ranges from 150 nm to 250 nm. Further, in an example, the wire width W2' is 60 nm, the wire spacing P2' is 60 nm, and the height H2' is 200 nm.

Figure 17:
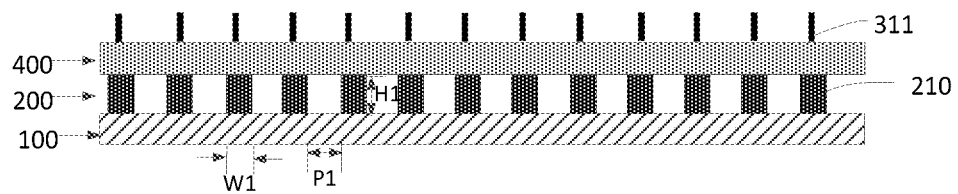
FIG. 17 shows a schematic diagram of step S033 for manufacturing the wire grid polarizer shown in FIG. 7 in the method of manufacturing the wire grid polarizer provided by the present disclosure.

An ashing treatment is then performed on the second imprinting adhesive nano-photoresist strips 10 to form imprinting adhesive grid strips 311 (as shown in FIG. 17).

For example, in some embodiments, the size parameters of the imprinting adhesive grid strips 311 formed after the second imprinting adhesive nano-photoresist strips 10 is ashed may be as follows. the wire width W' ranges from 10 nm to 30 nm, the wire spacing P' ranges from 50 nm to 150 nm, and the height H' ranges from 60 nm to 100 nm. Further, in an example, the wire width W' is 20 nm, the wire spacing P' is 100 nm, and the height H' is 80 nm.

A second reflection material layer is then deposited on the imprinting adhesive grid strips 311.

Where the second reflection material layer can be formed by using a evaporation or sputter process, and the second reflection material layer may selected as a metal material, such as any one of aluminum, gold, chromium, silver and copper. Depending on the process conditions, the thickness of the second reflection material layer relates to a relative position of the second reflection material layer to the imprinting adhesive grid strips 311, the thickness of the second reflection material layer on the top end of the imprinting adhesive grid strip 311 is greater than the following two, the thickness of the second reflection material layer at a region between adjacent imprinting adhesive grid strips 311, and the thickness of the second reflection material layer at the side face(s) of the imprinting adhesive grid strip 311. For example, in an exemplary embodiment, the thickness of the second reflection material layer on the top end of the imprinting adhesive grid strip 311 ranges from 30 nm to 90 nm, the thickness of the second reflection material layer at the region between adjacent imprinting adhesive grid strips 311 ranges from 10 nm to 30 nm, and the thickness of the second reflection material layer at the side face(s) of the imprinting adhesive grid strip 311 ranges from 5 nm to 15 nm. Further, in an example, the thickness of the second reflection material layer on the top end of the imprinting adhesive grid strip 311 is 60 nm, the thickness of the second reflection material layer at the region between adjacent imprinting adhesive grid strip 311 is 20 nm, and the thickness of the second reflection material layer at the side face(s) of the imprinting adhesive grid strip 311 is 10 nm.

Figure 18:
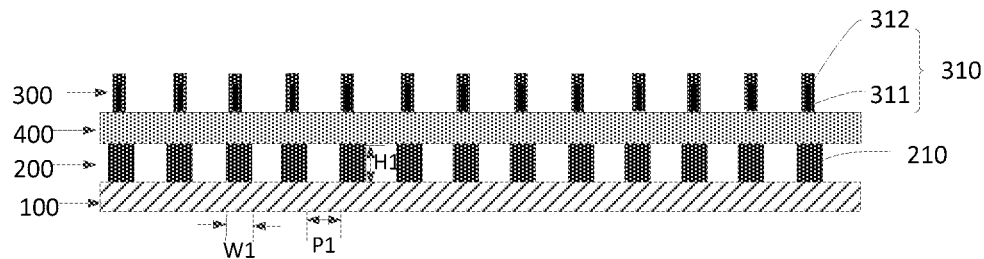
FIG. 18 shows a schematic diagram of step S035 for manufacturing the wire grid polarizer shown in FIG. 7 in the method of manufacturing the wire grid polarizer provided by the present disclosure.

A dry etching is then performed on the second reflection material layer to form a reflection grid strips 312, where each of the reflection grid strips 312 wraps on the top end and the side face(s) of a corresponding one of the imprinting adhesive grid strips 311, and the imprinting adhesive grid strip 311 and the reflection grid strip 312 form the second reflection grid strip 310 (as shown in FIG. 18).

For example, in some embodiments, after the dry etching is performed on the second reflection material layer, the size parameters of the reflection grid strip 312 wrapping the imprinting adhesive grid strip 311 is as follows. A wire width W''' ranges from 20 nm to 40 nm, a wire spacing P''' ranges from 50 nm to 120 nm, and a height H''' ranges from 10 nm to 30 nm. Further, in an example, the wire width W''' is 30 nm, the wire spacing P''' is 90 nm, and the height H''' is 20 nm.

In view the above, in the wire grid polarizer provided by the above-mentioned embodiments of the disclosure, the second wire grid 30 are formed by the imprinting adhesive grid strips 311 and the reflection grid strips 312 jointly, so that the same imprinting template can be used when manufacturing the first wire grid 200 and the second wire grid 300, and two wire grids with different size parameters can be obtained, which greatly saves the manufacturing cost of the wire grid polarizer, and has a very important significance for the wire grid polarizer with stacked layers.

In an exemplary embodiment as shown in FIG. 7, the size parameters of the first wire grid reflection strip 210 in the first wire grid 200 is as follows. The wire width W1 ranges from 50 nm to 70 nm, the wire spacing P1 ranges from 50 nm to 70 nm, and the height H1 ranges from 150 nm to 250 nm. In the second wire grid 300, the imprinting adhesive grid strip 311 has a wire width of 10 nm to 30 nm, a wire spacing P' of 50 nm to 150 nm and a height H' of 60 nm to 100 nm; the reflection grid strip 312 has a wire width W''' of 20 nm to 40 nm, a wire spacing P''' of 50 nm to 120 nm, and a height H''' of 10 nm to 30 nm.

In a specific exemplary embodiment, the size parameters of the first wire grid reflection strip 210 in the first wire grid 200 are as follows. The wire width W1 is 60 nm, the wire spacing P1 is 60 nm, and the height H1 is 200 nm. In the second wire grid 300, the imprinting adhesive grid strip 311 has a wire width W' of 20 nm, a wire spacing P' of 100 nm, and a height H' of 80 nm; the reflection grid strip 312 has a wire width W''' of 30 nm, a wire spacing P''' of 90 nm and a height H''' of 120 nm.

Of course, the above is only an example, and the structure size parameters of the first wire grid 200 and the second wire grid 300 can be adjusted in practical applications, which is not limited thereto will omitted herein.

A schematic structural diagram for the wire grid polarizer provided by other exemplary embodiments of the present disclosure is shown in the figure.

As shown in FIG. 9, the embodiment shown in FIG. 9 differs from the embodiment shown in FIG. 7 in that: in the embodiment shown in FIG. 7, each of the reflection grid strips 312 covers the top end and side face of the corresponding imprinting adhesive grid strip 311, while in the embodiment shown in FIG. 9, each of the reflection grid strips 312 covers only the top end of the corresponding imprinting adhesive grid strip 311.

Accordingly, the difference in the manufacturing process between the above-mentioned wire grid polarizer in the embodiment shown in FIG. 9 and the wire grid polarizer in the embodiment shown in FIG. 7 is: the wire grid polarizer shown in the figure may be further dry etched to obtain the wire grid polarizer shown in FIG. 9 when a dry etching is performed on the second reflection material layer.

In the above-mentioned embodiment shown in FIG. 9, the wire width of the imprinting adhesive grid strip is the same or substantially the same as the wire width of the reflection grid strip, and a ratio of the height of the imprinting adhesive grid strip to the height of the reflection grid strip ranges from 3:1 to 5:1.

In some embodiments, the imprinting adhesive grid strip 311 has a wire width W' of 10 nm to 30 nm, a wire spacing P' of 50 nm to 150 nm, and a height H' of 60 nm to 100 nm; the reflection grid strip 312 has a wire width W''' of 15 nm to 25 nm, a wire spacing P''' of 50 nm to 120 nm and a height H''' of 10 nm to 30 nm.

In a specific exemplary embodiment, for example, the imprinting adhesive grid strip 311 has a wire width W' of 20 nm, a wire spacing P' of 100 nm, and a height H' of 80 nm; the reflection grid strip 312 has a wire width W''' of 20 nm, a wire spacing P''' of 100 nm and a height H''' of 20 nm.

It is understood that the above is only an example, and the structure size parameters of the first wire grid 200 and the second wire grid 300 can be adjusted in practical applications, which is not limited thereto and will omitted herein.

It is noted that, if the embodiment shown in FIG. 9 is desired, the dry etching accuracy is required to be higher than that of the embodiment shown in FIG. 7 in practical application.

In addition, both the wire grid reflection material in the first wire grid reflection strip 210 and the reflection grid strip 312 in the second wire grid reflection strip 310 may select a metal material, where the metal material is any one of aluminum, gold, chromium, silver and copper. The metal material requires a higher transmittance of visible light, a less absorption of visible light and a higher conductive property, and the preferred material is aluminum. In the second wire grid reflection strip 310, the imprinting adhesive material of the imprinting adhesive grid strip 311 is selected to be a resin material, for example, an epoxy resin or an acrylic resin, etc. The substrate 100 may be made of a material capable of transmitting visible light, and the material forming the substrate 100 may be selected according to the use or process. The substrate 100 may be made of various polymers such as glass, quartz, acrylic resin, triacetate cellulose (TAC), cyclic olefin copolymer (COC), cyclic olefin polymer (COP), polycarbonate (PC), polyethylene terephthalate (PET), polyimide (PI), polyethylene naphthalate (PEN), polyether sulfone (PES) and polyarylate (PAR), but the disclosure is not limited thereto; the substrate 100 may also be made of an optical film having a certain degree of flexibility.

In addition, to explain more clearly that the wire grid polarizer provided by embodiments of the present disclosure can ensure both a higher transmittance and a high degree of polarization when compared with the wire grid polarizer in the related art, the following description is illustrated in conjunction with simulation experiments.

Figure 2:
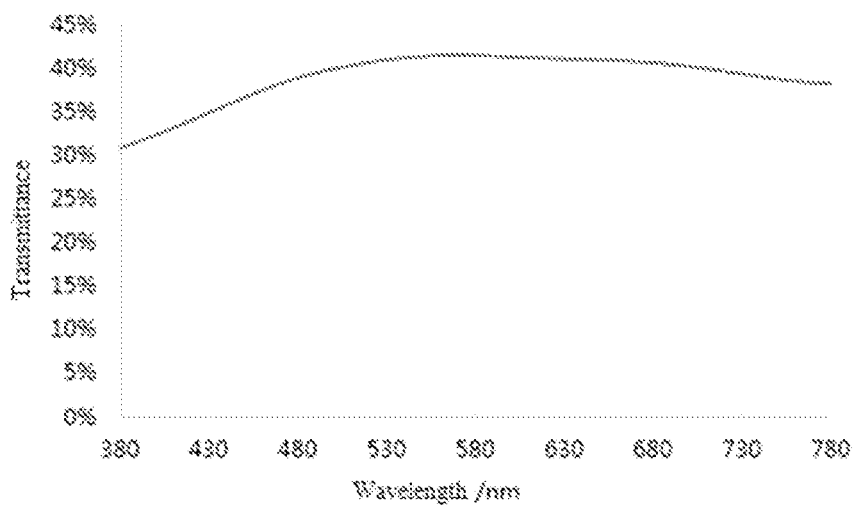
FIG. 2 is a schematic diagram showing the transmittance as a function of wavelength for the monolayer wire grid polarizer of FIG. 1.

FIG. 1 shows a schematic structural diagram of a monolayer WGP in the related art, and FIG. 2 shows a schematic diagram of the transmittance as a function of the wavelength for the monolayer WGP in the related art, where a horizontal coordinate is the wavelength in nm, a vertical coordinate is a degree of polarization, and a curve is a degree of polarization of the monolayer WGP structure as shown in FIG. 2 in the related art.

In an example in which the wire grid reflection strip 1 in the monolayer WGP uses aluminum (Al), the wire width W of the wire grid reflection strip 1 is 60 nm, the wire spacing P is 60 nm, and the height H is 200 nm, as shown in FIG. 2, the average transmittance of the WGP is 39.0%, and the degree of polarization can theoretically reach 99.999%. There are many ways to manufacture the WGP. For example, it can be manufactured by an imprinting process and an etching process, or by an imprinting process and an evaporation process, etc., which is not limited here. There are also many materials that can be used to make the wire grid reflection strip of the WGP, for example, metal Al (aluminum), Ag (silver), etc.

In the monolayer WGP structure in the related art shown in FIG. 1, the simulation calculation is performed on an example in which the wire grid reflection strip using metal Al, and the following size parameters of the wire grid reflection strip 2: the wire width W is 60 nm, the wire spacing P is 60 nm and the height H is 200 nm. However, in an actual manufacturing process, due to the limitation of process conditions, the degree of polarization of the WGP is difficult to reach 99.999%, and is generally only 99.9%. This will seriously affect the contrast and thus the display effect if applied in a display product.

Figure 3:
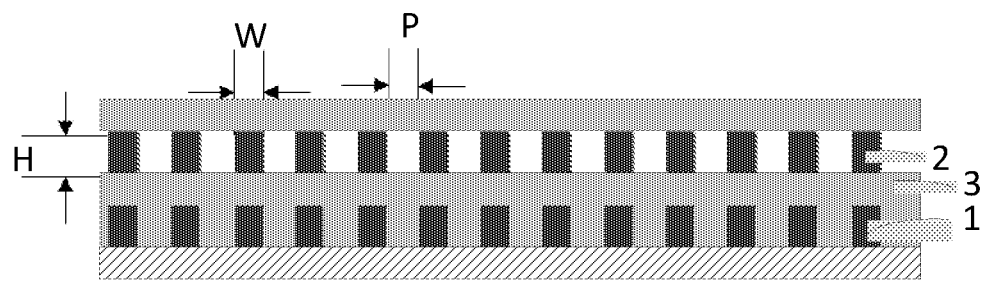
FIG. 3 shows a schematic structural diagram of a wire grid polarizer with stacked layers in related art.
Figure 4:
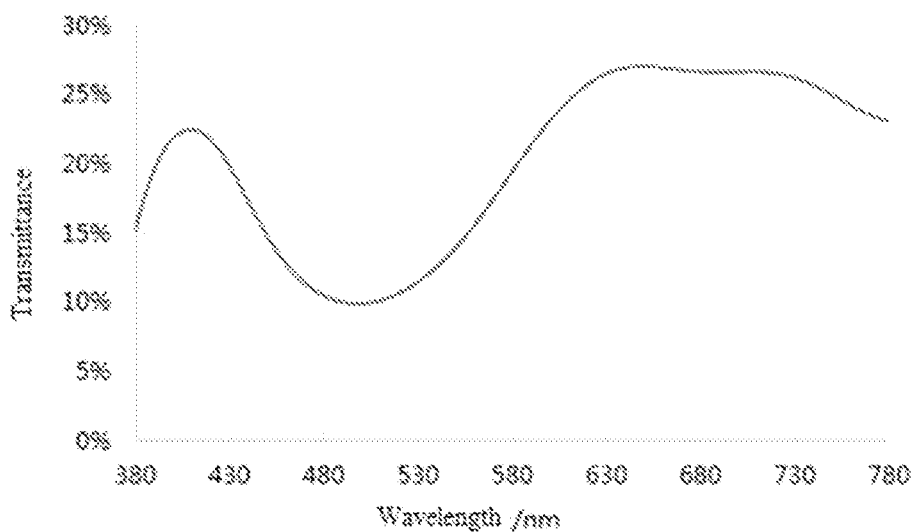
FIG. 4 is a schematic diagram showing the transmittance as a function of wavelength for the wire grid polarizer with stacked layers of FIG. 2.

FIG. 3 shows a schematic structure diagram of a dual-layer WGP in the related art, and FIG. 4 is a schematic diagram showing the transmittance as a function of the wavelength for the dual-layer WGP in the related art, where a horizontal coordinate is wavelength in nm, a vertical coordinate is a degree of polarization, and a curve is a degree of polarization of a wire grid polarizer having the dual-layer WGP structure in the related art as shown in FIG. 3. As shown in FIG. 3, an example in which an intermediate buffer layer 3 of an organic adhesive material is provided between the upper layer WGP2 and the lower layer WGP1, a thickness of the adhesive material is 250 nm, and the refractive index is 1.5 is taken as an example, where the organic adhesive material is filled into gaps of wire grid reflection strips of the lower layer WGP1.

Figure 5:
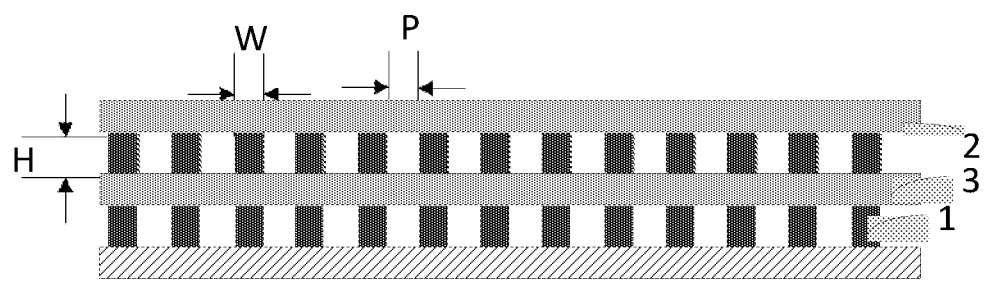
FIG. 5 shows another schematic structural diagram of a wire grid polarizer with stacked layers in related art.
Figure 6:
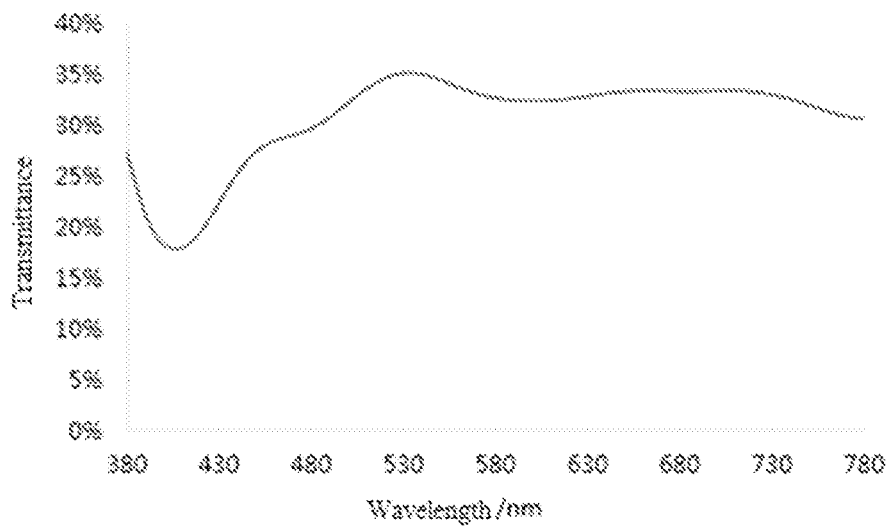
FIG. 6 is a schematic diagram showing the transmittance as a function of wavelength for the wire grid polarizer with stacked layers of FIG. 5.

FIG. 5 shows a schematic structure diagram of a dual-layer WGP in the related art, and FIG. 6 is a schematic diagram showing the transmittance as a function of the wavelength for the dual-layer WGP in the related art, where a horizontal coordinate is wavelength in nm, a vertical coordinate is a degree of polarization, and a curve is a degree of polarization for a wire grid polarizer having the dual-layer WGP structure in the related art as shown in FIG. 5. In FIG. 5, the intermediate buffer layer 3 disposed between the upper layer WGP2 and the lower layer WGP1 uses SiO2 (silicon oxide), the thickness is 250 nm, and the refractive index is 1.46.

It can be seen from FIGS. 4 and 6 that the degree of polarization of both of the WGPs with stacked layers in related art can reach more than 99.999% (the degree of polarization in an actual test is greater than 99.99%, which can correspond to the degree of polarization for the iodine-based polarizer and can normally dim the display screen), but the transmittance decreases to 20.2% and 30.6% respectively, and such a low transmittance will result in a large power consumption.

Figure 8:
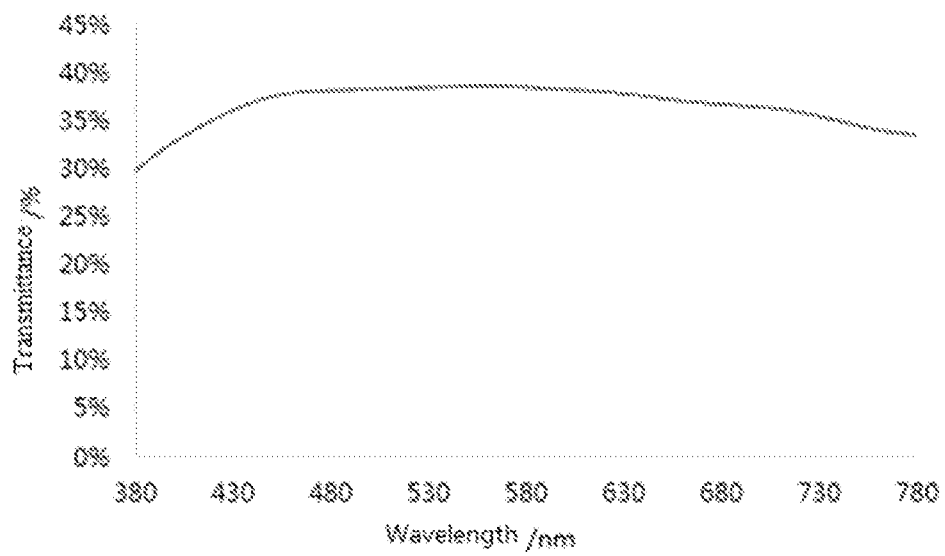
FIG. 8 is a schematic diagram showing the transmittance as a function of wavelength for the wire grid polarizer of FIG. 7.
Figure 10:
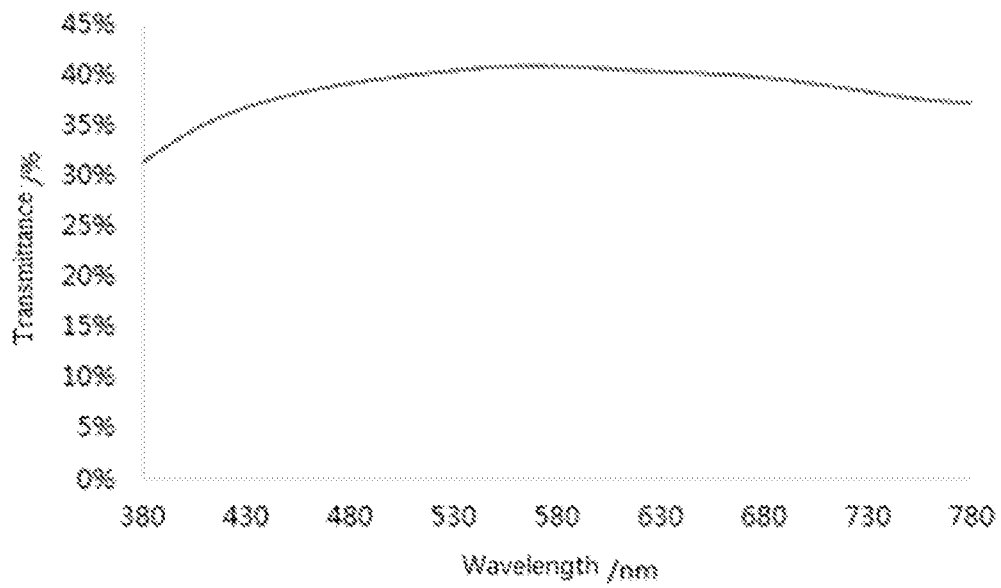
FIG. 10 is a schematic diagram showing the transmittance as a function of wavelength for the wire grid polarizer of FIG. 9.

FIGS. 7 and 9 show schematic structural diagrams of two exemplary wire grid polarizers provided by embodiments of the present disclosure, and FIG. 8 shows a schematic diagram of the wire grid polarization transmittance as a function of the wavelength according to the exemplary embodiment of the present disclosure as shown in FIG. 7, where the horizontal coordinate is wavelength in nm, the vertical coordinate is degree of polarization, and the curve is the degree of polarization of the wire grid polarizer structure for the exemplary embodiment of the present disclosure as shown in FIG. 7. FIG. 10 is a schematic diagram showing the wire grid polarization transmittance as a function of wavelength for the exemplary embodiment of the present disclosure shown in FIG. 9, where the horizontal coordinate is wavelength in nm, the vertical coordinate is degree of polarization, and the curve is the degree of polarization of the wire grid polarizer structure for the exemplary embodiment of the present disclosure shown in FIG. 9.

Where in the embodiment shown in FIG. 7, the first wire grid reflection strip 210 has a wire width W1 of 60 nm, a wire spacing P1 of 60 nm, and a height H1 of 200 nm; the second wire grid reflection strip 310 has a wire width W2 of 30 nm, a wire spacing P2 of 90 nm, and a height H2 of 120 nm. In the embodiment shown in FIG. 9, the first wire grid reflection strip 210 has a wire width W1 of 60 nm, a wire spacing P1 of 60 nm, and a height H1 of 200 nm; the second wire grid reflection strip 310 has a wire width W2 of 20 nm, a wire spacing P2 of 100 nm, and a height H2 of 100 nm.

As can be seen from FIGS. 8 and 10, the wire grid polarizer provided by the embodiments of the present disclosure has both a high transmittance and high a degree of polarization by changing the structure parameters of the second wire grid 300, the degree of polarization of the wire grid polarizer in the two embodiments is still above 99.9999, and the transmittance reaches 36.7% (shown in the figure) and 38.6% (shown in the figure), respectively.

In addition, in the related art, with respect to a WGP with stacked layers, in order to ensure the imprinting effect for a second layer of WGP, an intermediate buffer layer is provided between the first layer of WGP and the second layer of WGP, and the intermediate buffer layer is a stacked structure with four layers, that is to say, the intermediate buffer layer has four layers, which are A first silicon oxide (SiOx) buffer layer, an organic adhesive (OC) buffer layer, a silicon nitride (SiNx) buffer layer and a second silicon oxide (SiOx) buffer layer from the top to the bottom, where the first silicon oxide buffer layer has the least influence on PE and TR; the organic adhesive buffer layer functions as planarizing the first layer WGP to ensure the planarization of the imprinting interface; the silicon nitride buffer layer can improve the adhesion between the organic adhesive buffer layer and the second silicon oxide buffer layer; and the second silicon oxide buffer layer is buffer layer for dry-etching of the second layer of WGP, so as to ensure the morphology of the second layer of WGP. Such an intermediate buffer layer of a structure with four stacked layer leads to a complicated manufacturing process and a high preparation cost for the wire grid polarizer. Moreover, within the visible light range, the transmittance of SiNx is 85%~90%, the transmittance of OC is 98%, and the transmittance of SiOx reaches 100%, thereby also resulting in an issue of lowering the optical transmittance of the Wire Grid WGP.

In order to address the above-mentioned issues, in the wire grid polarizer provided by embodiments of the present disclosure, at least one intermediate buffer layer 400 is provided between the first wire grid 200 and the second wire grid 300, and the layer number of the intermediate buffer layer 400 is less than or equal to 3. That is, the layer number of the intermediate buffer layer 400 is reduced when compared with the intermediate buffer layer 400 in the related art in which the WGP with stacked layers has a structure of four stacked layers, so that the optical transmittance of the intermediate buffer layer 400 can be improved, the manufacturing process can be simplified, and the cost can be reduced, and the optical transmittance of the wire grid polarizer can also be improved due to the reduced layers in the intermediate buffer layer 400.

In an exemplary embodiment, the intermediate buffer layer 400 has only one layer, and the material of the intermediate buffer layer 400 is formed by at least one of silicon nitride and silicon oxide, and a film layer thickness of the intermediate buffer layer 400 ranges from 0.8 microns to 1.0 microns.

In the above-mentioned exemplary embodiment, the intermediate buffer layer for the wire grid polarizer with stacked layers is simplified from a four stacked layer structure to a monolayer structure, which can achieve the technical effects of shortening the process time and improving the optical characteristics of the device, and thus addressing the issue that a process for preparing a four stacked layer structure is complicated and the cost is high.

Through simulation tests on the wire grid polarizer with a monolayer buffer intermediate layer, it is determined that in a case that the film layer thickness of the monolayer buffer intermediate layer is 0.8 μm to 1.0 μm, the requirements for the planarization and warpage of the buffer intermediate layer can be met, so as to ensure the planarization of the imprinting interface and ensure the morphology of the WGP. In a case that the film layer thickness of the monolayer buffer interlayer is less than 0.8 μm, the planarization of the buffer interlayer cannot meet the requirements. In a case that the thickness of the monolayer buffer interlayer is greater than 1 micron, it is apt to warp. The material of the monolayer buffer intermediate layer is preferably silicon oxide. It is understood that the above is only an example, and the material of the monolayer buffer intermediate layer and the film layer thickness are not limited thereto in practical applications, and the buffer intermediate layer may not be a monolayer, but may be a dual layer or a triple layer.

In addition, it is be noted that in the above-mentioned embodiments, the second wire grid including the imprinting adhesive grid strips and the reflection grid strips is for saving the cost of the imprinting template. In other embodiments of the present disclosure, as shown in FIG. 11, the second wire grid 300 may also be formed by the wire grid reflection material only.

Figure 12:
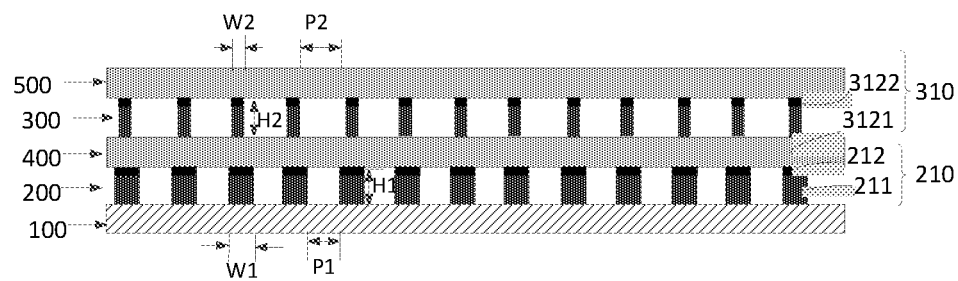
FIG. 12 shows a structural diagram of yet another exemplary embodiment of a wire grid polarizer provided by the present disclosure.

Furthermore, in some other exemplary embodiments of the present disclosure, as shown in FIG. 12, the first wire grid reflection strip 210 includes a first reflection material strip 211 and a first mask photoresist strip 212 overlaid on a side of the first reflection material strip 211 away from the substrate 100, and the reflection grid strip 312 in the second wire grid reflection strip 310 includes a second reflection material strip 3121 and a second mask photoresist strip 3122 overlaid on a side of the second reflection material strip 3121 away from the substrate 100. Both the first reflection material strip 211 and the reflection grid strip 312 can be made of a metal material, for example, the metal material is any one of aluminum, gold, chromium, silver and copper. Requirements for the metal material are a higher transmittance to the visible light, a less absorption of the visible light and a higher conductive property; the material is preferably aluminum. The first mask photoresist strip 212 (Hard Mask 1) and the second mask photoresist strip 3122 (Hard Mask 2) are made of a photoresist material.

In the above-mentioned embodiments, in a case that the first wire grid reflection strip 210 is formed by a first reflection material only, and the reflection grid strip 312 in the second wire grid reflection strip 310 is formed by a second reflection material only, when fabricating the wire grid polarizer, an organic compound, such as an ester, is selected as the imprinting adhesive material in the nano-imprinting process, so that the imprinting adhesive nano-photoresist array formed after the imprinting adhesive is patterned can be directly used as a mask, for implementing a dry etching on the wire grid material layer;

In a case that the first wire grid reflection strip 210 includes a first reflection material strip 211 and a first mask photoresist strip 212 which is overlaid on a side of the first reflection material strip 211 away from the substrate 100, and the reflection grid strip 312 in the second wire grid reflection strip 310 includes a second reflection material strip 3121 and a second mask photoresist strip 3122 which is overlaid on a side of the second reflection material strip 3121 away from the substrate 100, the imprinting adhesive material is selected to be an organic compound such as an ester in the nano-imprinting process, so that a mask can be formed by the photoresist material, for the dry etching of the wire grid material layer.

Figure 13:
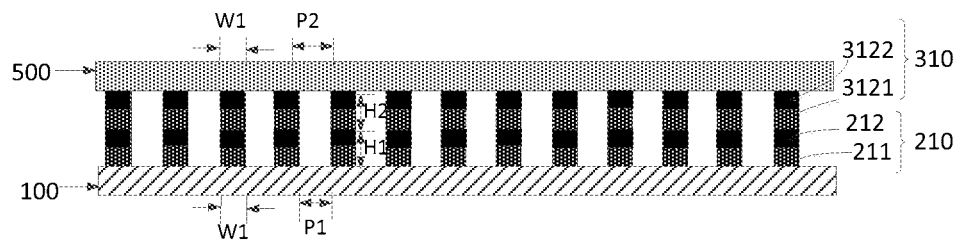
FIG. 13 shows a structural diagram of still yet another exemplary embodiment of a wire grid polarizer provided by the present disclosure.

In addition, in order to address the issues in the preparation process of the WGP with stacked layers such as a process for fabricating a buffer intermediate layer including a four stacked layer structures on a first layer WGP is complex and the resultant optical grating is apt to collapse, as shown in FIG. 13, a wire grid polarizer provided in some exemplary embodiments of the present disclosure includes:

a substrate 100;

a first wire grid 200 formed on the substrate 100, the first wire grid 200 includes a plurality of first wire grid reflection strips 210 arranged in parallel to each other and at equal intervals, each of the first wire grid reflection strips 210 includes a first reflection material strip 211 and a first mask photoresist strip 212 overlaid on a side of the first reflection material strip 211 away from the substrate 100; and a second wire grid 300 formed on one side of the first wire grid 200 away from the substrate 100, the second wire grid 300 including a plurality of second wire grid reflection strips 310 arranged in parallel and at equal intervals, the second wire grid reflection strips 310 including a second reflection material strip 3121 and a second mask photoresist strip 3122 overlaid on a side of the second reflection material strip 3121 away from the substrate 100;

where the second wire grid reflection strips 310 are in one-to-one correspondence with the first wire grid reflection strips 210, an orthographic projection of a second wire grid reflection strip 310 onto the substrate 100 falls within an orthographic projection of a corresponding first wire grid reflection strip 210 onto the substrate 100, and the second wire grid 300 is in direct contact with the first wire grid 200.

In the above-mentioned embodiment, the first wire grid 200 and the second wire grid 300 are in direct contact, that is to say, there is no buffer intermediate layer between the first wire grid 200 and the second wire grid 300, In this manner, in the manufacturing process, a first reflection material layer, a first mask photoresist material layer 21, a second reflection material layer and a second mask photoresist material layer 41 may be prepared in the sequence listed, respectively. In other words, two reflection material layers and two photoresist material layers (Hard Mask) are prepared first, and the dual-layer WGP is etched in one-shot dry etching. In this way, the process is simplified, and only one nano-imprinting and dry etching process is needed, so as to achieve the following technical effects: shortening the process time, improving the process stability, and optimizing the morphology and optical properties of the optical grating. The following technical issues can be addressed: a complex preparation process and poor process stability for the WGP with stacked layers in the related art. For the specific method of manufacturing the wire grid polarizer provided by embodiments of the present disclosure, a detailed description will be given when describing the method of manufacturing the wire grid polarizer provided by embodiments of the present disclosure, which will not be described in detail here.

Further, in some of the embodiments shown in FIG. 13, the wire width W2 of the second wire grid reflection strip 310 is equal to the wire width W1 of the first wire grid reflection strip 210, and the wire spacing P2 for the second wire grid reflection strip 310 is equal to the wire spacing P1 for the first wire grid reflection strip 210. In this way, it can be realized more easily in a case that the size parameters of the first wire grid 200 and the size parameters of the second wire grid 300 are the same or similar when the dual layers of WGP is etched by one-shot dry etching.

In addition, in the wire grid polarizer provided embodiments of the present disclosure, a protective layer 500 is further provided on a side of the second wire grid 300 away from the substrate 100.

A method of manufacturing a wire grid polarizer provided by embodiments of the present disclosure will be described in detail hereinafter.

FIGS. 14 to 18 are diagrams showing a method of manufacturing a wire grid polarizer provided in some embodiments of the present disclosure, where the method may be used to manufacture the wire grid polarizer in the embodiment as shown in FIG. 7. The method of manufacturing the wire grid polarizer includes the following steps.

In step S01, a substrate 100 is provided.

Where the substrate 100 may be made of a material capable of transmitting visible light, the material forming the substrate 100 may be selected according to actual use or process. The substrate 100 may be made of various polymers such as glass, quartz, acrylic resin, triacetate cellulose (TAC), cyclic olefin copolymer (COC), cyclic olefin polymer (COP), polycarbonate (PC), polyethylene terephthalate (PET), polyimide (PI), polyethylene naphthalate (PEN), polyether sulfone (PES) and polyarylate (PAR), but not limited thereto. The substrate 100 may also be made of an optical film having a certain degree of flexibility.

In step S02, a first wire grid 200 is formed on the substrate 100, where the first wire grid 200 includes a plurality of first wire grid reflection strips 210 arranged parallel to each other and at equal intervals.

In step S03, a second wire grid 300 is formed on a side of the first wire grid 200 away from the substrate 100, where the second wire grid 300 includes a plurality of second wire grid reflection strips 310 arranged in parallel to each other and at equal intervals, where the second wire grid reflection strips 310 are in one-to-one correspondence with the first wire grid reflection strips 210, an orthographic projection of each of the second wire grid reflection strips 310 onto the substrate 100 falls within an orthographic projection of a corresponding one of the first wire grid reflection strips 210 onto the substrate 100; and a wire width W for the second wire grid reflection strips 310 is less than a wire width W for the first wire grid reflection strips 210, a wire spacing P for the second wire grid reflection strips 310 is greater than a wire spacing P for the first wire grid reflection strips 210.

In embodiments of the present disclosure, the wire grid polarizer is a WGP with stacked layers, including at least a first wire grid 200 and a second wire grid 300, by changing the structure parameters of the second wire grid 300 (namely, an upper layer WGP) located on a side of the first wire grid 200 away from the substrate 100, the wire spacing P2 of the second wire grid 300 is greater than the wire spacing P1 of the first wire grid 200 (namely, a lower layer wire grid), and the wire width W2 for the second wire grid 300 is less than the wire width W1 for the first wire grid 200. Compared with the solution in which the size parameters of the first layer of WGP and the second layer of WGP is the same in the related art, more light can be emitted from the gaps between the second wire grid reflection strips 310, and thus the transmittance of the wire grid polarizer can be improved. Therefore, the wire grid polarizer provided by embodiments of the present disclosure has both a high degree of polarization and high transmittance characteristics, the issue of a poor optical performance for the WGP with stacked layers when being in display products can be addressed.

Further, in the method of manufacturing the wire grid polarizer provided by embodiments of the present disclosure, the above-mentioned step S02 may specifically include the following steps.

In step S021, a first reflection material layer is formed on the substrate 100.

Where the first reflection material layer can be selected to be a metal material, for example, any one of aluminum, gold, chromium, silver and copper. Requirements for the metal material are a higher transmittance to the visible light, a lower absorption of the visible light and a higher conductive property, and a preferred material is aluminum.

In step S022, a plurality of first imprinting adhesive nano-photoresist strips arranged parallel to each other and at equal intervals are formed on the first reflection material layer by using a nano-imprinting.

For example, in some embodiments, the size parameters of the first imprinting adhesive nano-photoresist strip may be as follows: a wire width W1' ranges from 50 nm to 70 nm, a wire spacing P1' ranges from 50 nm to 70 nm, a height H1' ranges 150 nm to 250 nm. Further, in an example, the wire width W1' is 60 nm, the wire spacing P1' is 60 nm, and the height H1' is 200 nm.

In step S023, the first reflection material layer is etched with the plurality of first imprinting adhesive nano-photoresist strips as a mask, to form a plurality of first wire grid reflection strips 210 arranged parallel to each other and at equal intervals, and the first imprinting adhesive nano-photoresist strips are removed so as to form the first wire grid 200 (as shown in FIG. 14).

For example, in some embodiments, the size parameters of the first wire grid reflection strip 210 of the first wire grid 200 may be as follows: a wire width W1 ranges from 50 nm to 70 nm, a wire spacing P1 ranges from 50 nm to 70 nm, and a height H1 ranges from 150 nm to 250 nm. Further, in an example, the wire width W1 is 60 nm, the wire spacing P1 is 60 nm, and the height H1 is 200 nm.

Where the specific process of the above-mentioned step S022 can be as follows.

In step S0221, a nano-imprinting template is provided, and the nano-imprinting template is fill with a photoresist material to obtain a nano-imprinting assembly;

In step S0222, the nano-imprinting assembly is combined with the substrate 100 on which the first reflection material layer is formed, so that a photoresist material is cured on a surface of the first reflection material layer, the nano-imprinting template is removed to form a plurality of first imprinting adhesive nano-photoresist strips on the surface of the first reflection material layer;

In addition, in the method of manufacturing the wire grid polarizer provided by embodiments of the present disclosure, the above-mentioned step S03 may specifically include the following steps.

Figure 15:
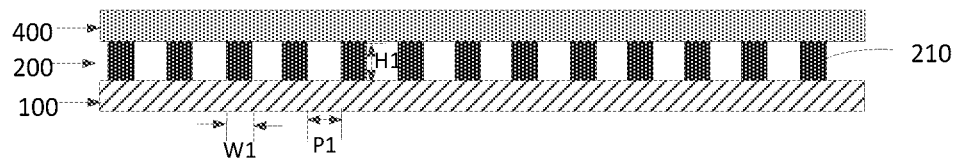
FIG. 15 shows a schematic diagram of step S031 for manufacturing the wire grid polarizer shown in FIG. 7 in the method of manufacturing the wire grid polarizer provided by the present disclosure.

In step S031, as shown in FIG. 15, an intermediate buffer layer 400 is formed on a side of the first wire grid 200 away from the substrate 100.

Where the intermediate buffer layer 400 may be formed by magnetron sputtering, thermal evaporation or other film-forming methods, and the material may be selected from any one or more of organic adhesive or silicon oxide or silicon nitride. For example, in some embodiments, the intermediate buffer layer 400 is selected to be silicon oxide, the thickness is 250 nm, and the refractive index is 1.46. Also, when the method of manufacturing the wire grid polarizer provided by embodiments of the present disclosure is used to manufacture the wire grid polarizer in the embodiment as shown in the figure, the intermediate buffer layer 400 may have only one layer.

In step S032, as shown in FIG. 16, a plurality of second imprinting adhesive nano-photoresist strips 10 arranged parallel to each other and at equal intervals is formed on the intermediate buffer layer 400 by nano-imprinting.

Where in step S032 and the above-mentioned step S022, the nano-imprinting template used is the same template. For example, in some embodiments, the size parameters of the second imprinting adhesive nano-photoresist strip 10 may be as follows: a wire width W2' ranges from 50 nm to 70 nm, a wire spacing P2' ranges from 50 nm to 70 nm, a height H2' ranges from 150 nm to 250 nm. Further, in an example, the wire width W2' is 60 nm, the wire spacing P2' is 60 nm, and the height H2' is 200 nm.

In step S033, as shown in FIG. 17, an ashing treatment is performed on the second imprinting adhesive nano-photoresist strips 10 to form imprinting adhesive grid strips 311. In some embodiment, the size parameters of the imprinting adhesive grid strip 311 may be as follows: a wire width W' ranges from 10 nm to 30 nm, a wire spacing P' ranges from 50 nm to 150 nm, and a height H' ranges from 60 nm to 100 nm. Further, in an example, the wire width W' is 20 nm, the wire spacing P' is 100 nm, and the height H' is 80 nm.

In step S034, a second reflection material layer is deposited on the imprinting adhesive grid strip 311.

For the first reflection material layer, an evaporation may be used or a metal material, for example, any one of aluminum, gold, chromium, silver and copper may be selected. The second reflection material layer can be made by using a process such as the deposition (sputter) or evaporation, and the thickness of the second reflection material layer relates to the position of the second reflection material layer in relation to the imprinting adhesive grid strip 311 depending on the process conditions. The thickness of the second reflection material layer at a top end of an imprinting adhesive grid strip 311 is greater than the thickness of the second reflection material layer at regions between adjacent imprinting adhesive grid strips 311, and greater than the thickness of the second reflection material layer at side face(s) of the imprinting adhesive grid strip 311. For example, in an exemplary embodiment, the thickness of the second reflection material layer at the top end of the imprinting adhesive grid strip 311 ranges from 30 nm to 90 nm, the thickness of the second reflection material layer at the regions between adjacent imprinting adhesive grid strips 311 ranges from 10 nm to 30 nm, and the thickness of the second reflection material layer at the side face(s) of the imprinting adhesive grid strip 311 ranges from 5 nm to 15 nm. Further, in an example, the thickness of the second reflection material layer at the top end of the imprinting adhesive grid strip 311 is 60 nm, the thickness of the second reflection material layer at the regions between adjacent imprinting adhesive grid strip 311 is 20 nm, and the thickness of the second reflection material layer at the side face(s) of the imprinting adhesive grid strip 311 is 10 nm.

In step S035, a dry etching is performed on the second reflection material layer to form reflection grid strips 312.

When manufacturing the wire grid polarizer in the embodiment as shown in FIG. 7, each of the reflection grid strips 312 encloses the top end and the side face(s) of a corresponding one of the wire grid strips 311, the imprinting adhesive grid strip 311 and the reflection grid strip 312 form the second wire grid reflection strip 310. For example, in some embodiments, the size parameters of the reflection grid strip 312, which is formed after the second reflection material layer is dry etched, surrounding the imprinting adhesive grid strip 311 are as follows: a wire width W" of 20 nm to 40 nm, a wire spacing P" of 50 nm to 120 nm, and a height H" of 10 nm to 30 nm. Further, in an example, the wire width W" is 30 nm, the wire spacing P" is 90 nm, and the height H" is 20 nm.

Figure 19:
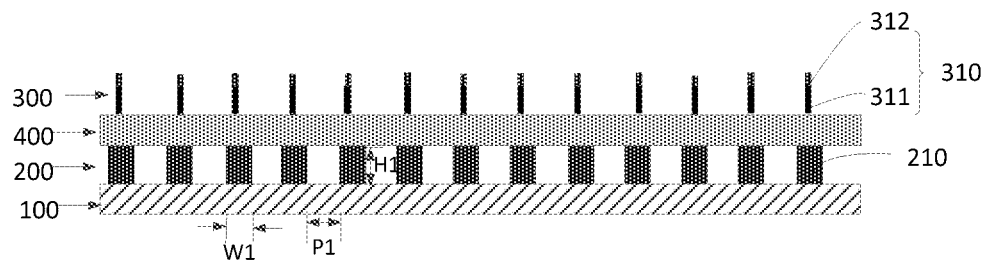
FIG. 19 shows a schematic diagram of step S035 for manufacturing the wire grid polarizer shown in FIG. 9 in the method of manufacturing the wire grid polarizer provided by the present disclosure.

In manufacturing the wire grid polarizer in the embodiment as shown in FIG. 9, the wire grid polarizer shown in FIG. 19 can be further dry etched when the dry etching is performed on the second reflection material layer, so as to obtain the wire grid polarizer shown in FIG. 9, so that each the reflection grid strip 312 only covers a top end of a corresponding imprinting adhesive grid strip 311. For example, in some embodiments, the imprinting adhesive grid strip 311 has a wire width W' of 10 nm to 30 nm, a wire spacing P' of 50 nm to 150 nm, and a height H' of 60 nm to 100 nm; the reflection grid strip 312 has a wire width W" of 15 nm to 25 nm, a wire spacing P" of 50 nm to 120 nm and a height H" of 10 nm to 30 nm.

In a specific exemplary embodiment, the imprinting adhesive grid strip 311 has a wire width W' of 20 nm, a wire spacing P' of 100 nm, and a height H' of 80 nm; the reflection grid strip 312 has a wire width W" of 20 nm, a wire spacing P" of 100 nm and a height H" of 20 nm.

In the method of manufacturing the wire grid polarizer provided in the above-mentioned embodiments of the disclosure, the second wire grid 300 is composed of an imprinting adhesive grid strip 311 and a reflection grid strip 312, so that the same imprinting template can be used when manufacturing the first wire grid 200 and the second wire grid 300 to obtain two wire grids with different size parameters. This greatly saves the manufacturing cost of the wire grid polarizer, which is very important for the wire grid polarizer with stacked layers.

In addition, it should be noted that, if the embodiment shown in the figure is desired, a higher accuracy for dry etching is required than the embodiment shown in the figure in practical applications.

Figure 20:
FIG. 20 shows a schematic diagram of step S02 for manufacturing the wire grid polarizer shown in FIG. 13 in the method of manufacturing the wire grid polarizer provided by the present disclosure.
Figure 21:
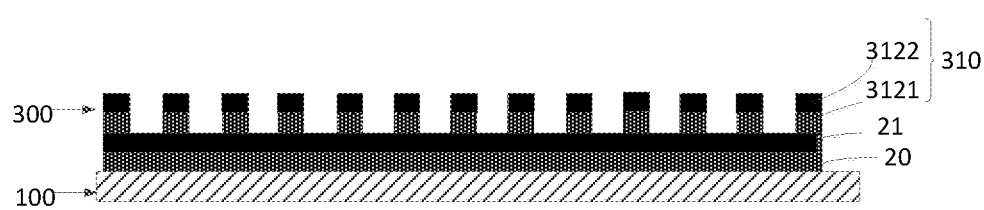
FIG. 21 shows a schematic diagram of step S05 for manufacturing the wire grid polarizer shown in FIG. 13 in the method of manufacturing the wire grid polarizer provided by the present disclosure.
Figure 22:
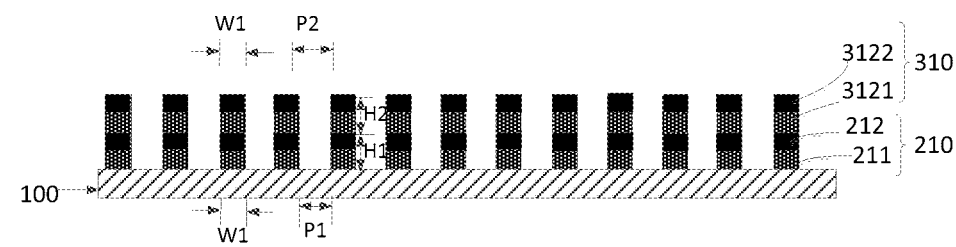
FIG. 22 shows a schematic diagram of step S07 for manufacturing the wire grid polarizer shown in FIG. 13 in the method of manufacturing the wire grid polarizer provided by the present disclosure.

In addition, as shown in FIGS. 20 to 22, embodiments of the present disclosure also provides a method of manufacturing a wire grid polarizer, for manufacturing the wire grid polarizer in the embodiment as shown, the method specifically includes the following steps.

In step S01, a substrate 100 is provided.

In step S02, as shown in FIG. 20, a first reflection material layer 20, a first photoresist material layer 21, a second reflection material layer 40 and a second photoresist material layer 41 are formed on the substrate 100 in the sequence listed.

In step S03, a plurality of imprinting adhesive nano-photoresist strips arranged parallel to each other and at equal intervals are formed on the second photoresist material layer 41 by nano-imprinting.

In step S04, the second photoresist material layer 41 is etched with the imprinting adhesive nano-photoresist strips as a mask, so as to pattern and form a plurality of second mask photoresist strips 3122 arranged parallel to each other and at equal intervals.

In step S05, the imprinting adhesive nano-photoresist strip is removed, and a dry etching is performed on the second reflection material layer with the second mask photoresist strips 3122 as a mask, so as to pattern and form a plurality of second reflection material strips 3121 arranged parallel to each other and at equal intervals. The second mask photoresist strip and the second reflection material strip 3121 are stacked to form the second reflection material strip 3121 (as shown in FIG. 21).

In step S06, the first photoresist material layer 21 is etched with the second mask photoresist strips 3122 as a mask, so as to pattern and form a plurality of first mask photoresist strips arranged parallel to each other and at equal intervals.

In step S07, as shown in FIG. 22, a dry etching is performed on the first reflection material layer 20 so as to pattern and form a plurality of first reflection material strips 211 arranged in parallel to each other and at equal intervals. The first mask photoresist strip and the first reflection material strips 211 are stacked to form the second wire grid reflection strip 310;

In the above-mentioned embodiments of the disclosure, there is no buffer intermediate layer between the first wire grid 200 and the second wire grid 300. In the manufacturing process, a first reflection material layer 20, a first mask photoresist material layer 21, a second reflection material layer 40 and a second mask photoresist material layer 41 are prepared respectively and in the sequence listed, namely, two reflection material layers and two photoresist material layers (Hard Mask) are prepared first, and the dual-layers of WGP is etched by one-shot dry etching, so that the process is simplified and only one nano-imprinting and dry etching process is need. The following technical effects can be achieved: shortening the process time, improving the process stability, and optimizing the morphology and optical properties of the optical grating, thereby addressing the technical issue of a complex preparation process and poor process stability for the WGP with stacked layers in the related art.

It is noted that, in the above disclosed embodiments, the thickness of the second photoresist material layer satisfies a predetermined value so that the second photoresist material layer is not completely etched when a dry etching is performed on the second reflection material layer, the first photoresist material layer, and the first reflection material layer.

In addition, in the method of manufacturing the wire grid polarizer provided by embodiments of the present disclosure, after forming the second wire grid 300, the method further includes forming a protective layer 500 on a side of the second wire grid 300 away from the substrate 100.

In addition, embodiments of the present disclosure also provide a display device, including the wire grid polarizer as provided by embodiments of the present disclosure. The display device includes the following components: radio unit, network module, audio output unit, input unit, sensor, display unit, user input unit, interface unit, memory, processor, power source, etc., but the present disclosure is not limited thereto. It will be appreciated by those skilled in the art that the structure of the display device described above is not intended to be a limitation for the display device, and that the display device may include more or less of the components listed above, or some of the components may be combined, or arranged with different components. In the embodiments of the present disclosure, the display device includes, but is not limited to, a displayer, a cell phone, a tablet, a television, a wearable electronic device, a navigation display device, etc.

The display device may be any product or component with display function, such as television, displayer, digital photo frame, mobile phone, tablet computer, where the display device further includes flexible circuit board, printed circuit board and backplate.

The following points need to be illustrated.

(1) The drawings for embodiments of the present disclosure relate only to structures related to embodiments of the present disclosure, and other structures may refer to general designs.

(2) For clarity, in the drawings for describing embodiments of the present disclosure, the thickness of layers or regions are exaggerated or reduced, namely, the drawings are not drawn to scale. It will be understood that when an element such as a layer, film, region, or substrate is referred to as "on" or "under" another element, it can be "directly on" or "directly under" the other element or an intervening element may be present therebetween.

(3) The embodiments and features in the embodiments of the present disclosure can be combined with each other to obtain a new embodiment if there is no conflict.

The above description is only specific implementations of the present disclosure, but the protection scope of the present disclosure is not limited thereto. The protection scope of the present disclosure is set forth by the appended claims.

What is claimed is:

1. A wire grid polarizer, wherein the wire grid polarizer comprises:
    a substrate;
    a first wire grid, formed on the substrate, the first wire grid comprising a plurality of first wire grid reflection strips arranged parallel to each other and at equal intervals; and
    a second wire grid, formed at a side of the first wire grid away from the substrate, the second wire grid comprising a plurality of second wire grid reflection strips arranged in parallel to each other and at equal intervals;
    wherein the plurality of second wire grid reflection strips is in one-to-one correspondence with the plurality of first wire grid reflection strips, an orthographic projection of one of the plurality of second wire grid reflection strips onto the substrate falls within an orthographic projection of a corresponding one of the plurality of first wire grid reflection strips onto the substrate, and a wire width for the plurality of second wire grid reflection strips is less than a wire width for the plurality of the first wire grid reflection strips, and a wire spacing for the plurality of second wire grid reflection strips is greater than a wire spacing for the plurality of first wire grid reflection strips;
    wherein the second wire grid is arranged in a first arrangement or a second arrangement;
    wherein in the first arrangement, the second wire grid comprises:
        a plurality of imprinting adhesive grid strips, arranged parallel to each other and at equal intervals, wherein the plurality of imprinting adhesive grid strips is formed by using an imprinting adhesive material, each of the plurality of imprinting adhesive grid strips comprises a top end located at a side away from the substrate, a bottom end located at a side adjacent to the substrate, and a side face located between the top end and the bottom end; and a plurality of reflection grid strips, arranged in parallel to each other and at equal intervals, wherein the plurality of reflection grid strips is formed by using a wire grid reflection material, the plurality of reflection grid strips is in one-to-one correspondence with the plurality of imprinting adhesive grid strips, and each of the plurality of reflection grid strips covers a top end and a side face of a corresponding one of the plurality of imprinting adhesive grid strips;

wherein in the second arrangement, the second wire grid comprises:

a plurality of imprinting adhesive grid strips, arranged parallel to each other and at equal intervals, wherein the plurality of imprinting adhesive grid strips is formed by using an imprinting adhesive material, each of the plurality of imprinting adhesive grid strips comprises a top end located at a side away from the substrate, a bottom end located at a side adjacent to the substrate, and a side face located between the top end and the bottom end; and a plurality of reflection grid strips, arranged in parallel to each other and at equal intervals, wherein the plurality of reflection grid strips is formed by using a wire grid reflection material, the plurality of reflection grid strips is in one-to-one correspondence with the plurality of imprinting adhesive grid strips, and each of the plurality of reflection grid strips is only located on a top end of a corresponding one of the plurality of imprinting adhesive grid strips.

2. The wire grid polarizer of claim 1, wherein in the first arrangement, a ratio of a wire width for the plurality of imprinting adhesive grid strips to a wire width for the plurality of reflection grid strips ranges from 1:2 to 1:1, and a ratio of a height for the plurality of imprinting adhesive grid strips to a height for the plurality of reflection grid strip ranges from 1:2 to 4:5.

3. The wire grid polarizer of claim 1, wherein in the second arrangement, a wire width for the plurality of imprinting adhesive grid strips is the same or substantially the same as a wire width for the plurality of reflection grid strip, and a ratio of a height for the plurality of imprinting adhesive grid strips to a height for the plurality of reflection grid strips ranges from 3:1 to 5:1.

4. The wire grid polarizer of claim 1, wherein in the first arrangement,
the wire grid reflection material of the first wire grid reflection strip is selected as a metal material; and
in the plurality of second wire grid reflection strips, the imprinting adhesive material for the plurality of imprinting adhesive grid strips is selected as a resin material, and the wire grid reflection material for the plurality of reflection grid strips is selected as a metal material.

5. The wire grid polarizer of claim 1, wherein the wire grid polarizer further comprises:
at least one intermediate buffer layer, located between the first wire grid and the second wire grid.

6. The wire grid polarizer of claim 5, wherein the layer number of the at least one intermediate buffer layer is less than or equal to 3.

7. The wire grid polarizer of claim 6, wherein the layer number of the at least one intermediate buffer layer is only one, and the at least one intermediate buffer layer is formed by using at least one material selected from silicon nitride and silicon oxide.

8. The wire grid polarizer of claim 7, wherein a film layer thickness for the at least one intermediate buffer layer ranges from 0.8 microns to 1.0 microns.

9. The wire grid polarizer of claim 1, wherein in the first arrangement,
the plurality of first wire grid reflection strips is formed only by a first wire grid reflection material, and the plurality of reflection grid strips in the plurality of second wire grid reflection strips is formed only by a second wire grid reflection material; or
the plurality of first wire grid reflection strip each comprises a first wire grid reflection material strip and a first mask photoresist strip overlaid on a side of the first wire grid reflection material strip away from the substrate, and the plurality of reflection grid strips in the plurality of second wire grid reflection strips each comprises a second wire grid reflection material strip and a second mask photoresist strip overlaid on a side of the second wire grid reflection material strip away from the substrate.

10. A wire grid polarizer, wherein the wire grid polarizer comprises:
a substrate;
a first wire grid, formed on the substrate, the first wire grid comprises a plurality of first wire grid reflection strips arranged parallel to each other and at equal intervals; and
a second wire grid, formed at a side of the first wire grid away from the substrate, the second wire grid comprises a plurality of second wire grid reflection strips arranged in parallel to each other and at equal intervals;
wherein the plurality of second wire grid reflection strips is in one-to-one correspondence with the plurality of first wire grid reflection strips, an orthographic projection of each of the plurality of second wire grid reflection strips onto the substrate falls within an orthographic projection of a corresponding one of the plurality of first wire grid reflection strips onto the substrate, and the second wire grid is in direct contact with the first wire grid;
wherein each of the plurality of first wire grid reflection strips comprises a first wire grid reflection material strip and a first mask photoresist strip overlaid on a side of the first wire grid reflection material strip away from the substrate; the plurality of second wire grid reflection strips each comprises a second wire grid reflection material strip and a second mask photoresist strip overlaid on a side of the second wire grid reflection material strip away from the substrate.

11. The wire grid polarizer of claim 10, wherein the wire grid polarizer comprises:
a wire width for the plurality of second wire grid reflection strips is equal to a wire width for the plurality of first wire grid reflection strips, and a wire spacing for the plurality of second wire grid reflection strips is equal to a wire spacing for the plurality of first wire grid reflection strips.

12. A method of manufacturing a wire grid polarizer, wherein the method is for manufacturing the wire grid polarizer of claim 10, the method comprises:
providing a substrate;
forming a first reflection material layer, a first photoresist material layer, a second reflection material layer and a second photoresist material layer in the sequence listed on the substrate;

forming, by a nano-imprinting, a plurality of imprinting adhesive nano-photoresist strips arranged parallel to each other and at equal intervals on the second photoresist material layer;

etching, with the plurality of imprinting adhesive nano-photoresist strips as a mask, the second photoresist material layer to pattern and form a plurality of second mask photoresist strips arranged parallel to each other and at equal intervals;

removing the plurality of imprinting adhesive nano-photoresist strip, and performing a dry etching, with the plurality of second mask photoresist strips as a mask, on the second reflection material layer to pattern and form a plurality of second wire grid reflection material strips arranged parallel to each other and at equal intervals, wherein the plurality of second mask photoresist strips and the plurality of second wire grid reflection material strips are stacked to form the plurality of second wire grid reflection material strips;

etching, with the plurality of second mask photoresist strips as a mask, the first photoresist material layer to pattern and form a plurality of first mask photoresist strips arranged parallel to each other and at equal intervals; and performing a dry etching on the first reflection material layer to pattern and form a plurality of first wire grid reflection material strips arranged parallel to each other and at equal intervals, wherein the plurality of first mask photoresist strips and the plurality of first wire grid reflection material strips are stacked to form the plurality of second wire grid reflection strip.

13. The method of claim 12, wherein a thickness of the second photoresist material layer satisfies a predetermined value so that the second photoresist material layer is not completely etched when performing the dry etching on the second reflection material layer, the first photoresist material layer and the first reflection material layer.

14. A method of manufacturing a wire grid polarizer, wherein the method comprises:

providing a substrate;

forming a first wire grid on the substrate, wherein the first wire grid comprises a plurality of first wire grid reflection strips arranged parallel to each other and at equal intervals;

forming a second wire grid on a side of the first wire grid away from the substrate, wherein the second wire grid comprises a plurality of second wire grid reflection strips arranged in parallel to each other and at equal intervals;

wherein the plurality of second wire grid reflection strips is in one-to-one correspondence with the plurality of first wire grid reflection strips, an orthographic projection of one of the plurality of second wire grid reflection strips onto the substrate falls within an orthographic projection of a corresponding one of the plurality of first wire grid reflection strips onto the substrate, and a wire width for the plurality of second wire grid reflection strips is less than a wire width for the plurality of first wire grid reflection strips, and a wire spacing for the plurality of second wire grid reflection strips is greater than a wire spacing for the plurality of first wire grid reflection strips;

wherein the step of forming a first wire grid on the substrate, the first wire grid comprising a plurality of first wire grid reflection strips arranged parallel to each other and at equal intervals further comprises:

forming a first reflection material layer on the substrate;

forming, by a nano-imprinting, a plurality of first imprinting adhesive nano-photoresist strips arranged parallel to each other and at equal intervals on the first reflection material layer;

etching, with the plurality of the first imprinting adhesive nano-photoresist strips as a mask, the first reflection material layer to form a plurality of first wire grid reflection strips arranged parallel to each other and at equal intervals, and removing the plurality of first imprinting adhesive nano-photoresist strips to form the first wire grid.

15. The method of claim 14, wherein the step of forming a second wire grid on a side of the first wire grid away from the substrate, the second wire grid comprising a plurality of second wire grid reflection strips arranged in parallel to each other and at equal intervals further comprises:

forming an intermediate buffer layer on a side of the first wire grid away from the substrate;

forming, by a nano-imprinting, a plurality of second imprinting adhesive nano-photoresist strips arranged parallel to each other and at equal intervals on the intermediate buffer layer;

performing an ashing treatment on the plurality of second imprinting adhesive nano-photoresist strips to form imprinting adhesive grid strips;

depositing a second reflection material layer on the imprinting adhesive grid strips; and performing a dry etching on the second reflection material layer to form reflection grid strips, wherein each of the reflection grid strips only covers a top end of a corresponding one of the imprinting reflection grid strips, or each of the reflection grid strips covers a top end and a side face of a corresponding one of the imprinting reflection grid strips, and the imprinting adhesive grid strips and the reflection grid strips form the plurality of second reflection grid strip.

16. The method of claim 15, wherein in the method, a nano-imprinting template used in forming the plurality of first imprinting adhesive nano-photoresist strips and a nano-imprinting template used in forming the plurality of second imprinting adhesive nano- photoresist strips are the same template.

* * * * *